United States Patent
Huh et al.

(10) Patent No.: US 12,453,056 B2
(45) Date of Patent: Oct. 21, 2025

(54) FOLDABLE ELECTRONIC DEVICE COMPRISING HEAT-DISSIPATING STRUCTURE

(71) Applicant: Samsung Electronics Co., Ltd., Suwon-si (KR)

(72) Inventors: Jaeyoung Huh, Suwon-si (KR); Jonghoon Lim, Suwon-si (KR); Ohhyuck Kwon, Suwon-si (KR); Ahreum Hwang, Suwon-si (KR); Sungchul Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 477 days.

(21) Appl. No.: 18/039,656

(22) PCT Filed: Apr. 13, 2021

(86) PCT No.: PCT/KR2021/004670
§ 371 (c)(1),
(2) Date: May 31, 2023

(87) PCT Pub. No.: WO2021/235700
PCT Pub. Date: Nov. 25, 2021

(65) Prior Publication Data
US 2023/0422448 A1    Dec. 28, 2023

(30) Foreign Application Priority Data
May 18, 2020  (KR) .......... 10-2020-0059305

(51) Int. Cl.
*H05K 7/20*  (2006.01)
*G06F 1/16*  (2006.01)
*G06F 1/20*  (2006.01)

(52) U.S. Cl.
CPC ....... *H05K 7/20481* (2013.01); *G06F 1/1652* (2013.01); *G06F 1/1681* (2013.01); *G06F 1/203* (2013.01); *G06F 2200/203* (2013.01)

(58) Field of Classification Search
CPC . H05K 7/20481; G06F 1/1652; G06F 1/1681; G06F 1/203; G06F 2200/203
(Continued)

(56) References Cited

U.S. PATENT DOCUMENTS 7,251,512 B2 * 7/2007 Komiyama ......... H04M 1/0214
439/165
8,760,864 B2   6/2014 Chiang
(Continued)

FOREIGN PATENT DOCUMENTS

CN    111147630 A    5/2020
JP    2006-253171 A    9/2006
(Continued)

OTHER PUBLICATIONS

Korean Office Action dated Oct. 15, 2024, issued in Korean Patent Application No. 10-2020-0059305.
(Continued)

*Primary Examiner* — Zhengfu J Feng
(74) *Attorney, Agent, or Firm* — Jefferson IP Law, LLP

(57) ABSTRACT

A heat dissipating structure of a foldable electronic device is provided. The electronic device includes a first housing including a first component, a second housing including a second component, a hinge assembly rotatably coupling the first and second housings, a hinge housing accommodating the hinge assembly and disposed between the first and second housings, a flexible display disposed from one region of the first housing to a region of the second housing across the hinge assembly, and foldable depending on a rotation of the hinge assembly, a first plate disposed between the
(Continued)

flexible display and the first housing, a second plate disposed between the flexible display and the second housing, and a first heat dissipating structure disposed between the first component and thermally coupled to one end of the hinge housing, and providing a first heat transfer path for transferring heat generated from the first component to the hinge housing.

18 Claims, 34 Drawing Sheets

(58) Field of Classification Search
USPC .......................................................... 361/704
See application file for complete search history.

(56) References Cited

U.S. PATENT DOCUMENTS

| | | |
|---|---|---|
| 9,148,979 B2 | 9/2015 | Chiriac et al. |
| 9,675,324 B2 | 6/2017 | Cho et al. |
| 9,980,412 B2 | 5/2018 | Qiu et al. |
| 10,223,959 B2 | 3/2019 | Aurongzeb et al. |
| 10,614,738 B2 | 4/2020 | Aurongzeb et al. |
| 10,905,009 B2 | 1/2021 | Choi |
| 2006/0126310 A1 | 6/2006 | Watanabe |
| 2017/0177034 A1 | 6/2017 | North et al. |
| 2018/0092253 A1* | 3/2018 | Qiu ........................ G06F 1/203 |
| 2019/0069451 A1* | 2/2019 | Myers ..................... G09G 5/14 |
| 2019/0166703 A1 | 5/2019 | Kim et al. |
| 2019/0189042 A1* | 6/2019 | Aurongzeb ........... G06F 1/1681 |
| 2019/0317572 A1* | 10/2019 | North ..................... G06F 1/203 |
| 2019/0371225 A1 | 12/2019 | Aurongzeb et al. |
| 2020/0204666 A1* | 6/2020 | Hong ..................... G06F 1/203 |
| 2022/0321683 A1 | 10/2022 | Luo et al. |

FOREIGN PATENT DOCUMENTS

| | | |
|---|---|---|
| KR | 10-2018-0062271 A | 6/2018 |
| KR | 10-2019-0062107 A | 6/2019 |
| KR | 10-2020-0007115 A | 1/2020 |
| KR | 10-2020-0046303 A | 5/2020 |
| KR | 10-2020-0077931 A | 7/2020 |
| KR | 10-2022-0068039 A | 5/2022 |

OTHER PUBLICATIONS

Korean Office Action dated Jun. 9, 2025, issued in a Korean Patent Application No. 10-2020-0059305.

* cited by examiner

FOLDABLE ELECTRONIC DEVICE COMPRISING HEAT-DISSIPATING STRUCTURE

CROSS-REFERENCE TO RELATED APPLICATION(S)

This application is a continuation application, claiming priority under § 365(c), of an International application No. PCT/KR2021/004670, filed on Apr. 13, 2021, which is based on and claims the benefit of a Korean patent application number 10-2020-0059305, filed on May 18, 2020, in the Korean Intellectual Property Office, the disclosure of which is incorporated by reference herein in its entirety.

BACKGROUND

1. Field

The disclosure relates to a heat dissipating structure of a foldable electronic device.

2. Description of Related Art

With the development of digital technologies, electronic devices are provided in various forms, such as a smart phone, a tablet personal computer (PC), a personal digital assistant (PDA), or the like. The electronic device is also developed such that it is portable or worn by a user to improve portability and user accessibility.

Recently, a portable electronic device, such as a smart phone, a table PC, or the like has been lighter and thinner for ease of portability, and has been developed in various fields for convenience of use. More particularly, despite that a foldable electronic device with a flexible display provides a relatively larger screen than a typical bar-type electronic device, portability can be improved since a size thereof is decreased when folded, thereby being spotlighted as an electronic device for satisfying consumers' preferences.

The foldable electronic device may include a flexible display and a plurality of housings. The plurality of housings and the flexible display may be coupled in a state of being supported by a hinge assembly, and may rotate the housing within a specified range according to a user's manipulation. The electronic device may be switched from a folded state to an unfolded state or from the unfolded state to the folded state through a process of rotating the plurality of housings.

The above information is presented as background information only to assist with an understanding of the disclosure. No determination has been made, and no assertion is made, as to whether any of the above might be applicable as prior art with regard to the disclosure.

SUMMARY

However, heat generated from at least one heating element mounted on a printed circuit board (PCB) disposed to the housing may not be radiated to the outside of the foldable electronic device. Therefore, the heat generated from the heating element may remain inside the housing.

Aspects of the disclosure are to address at least the above-mentioned problems and/or disadvantages and to provide at least the advantages described below. Accordingly, an aspect of the disclosure is to provide an electronic device including at least one heat dissipating structure providing a heat transfer path capable of transferring heat generated from the heating element and remaining inside the housing to the outside when the foldable electronic device is in a closed state or an open state.

Additional aspects will be set forth in part in the description which follows and, in part, will be apparent from the description, or may be learned by practice of the presented embodiments.

In accordance with an aspect of the disclosure, a foldable electronic device is provided. The foldable electronic device includes a first housing including at least one first component, a second housing including at least one second component, a hinge assembly rotatably coupling the first housing and the second housing, a hinge housing accommodating the hinge assembly, including one end and another end, and disposed between the first and second housings, a flexible display disposed from one region of the first housing to at least one region of the second housing across the hinge assembly, and foldable depending on a rotation of the hinge assembly, a first plate disposed between the flexible display and the first housing such that at least one portion thereof supports the flexible display, a second plate disposed between the flexible display and the second housing such that at least one portion thereof supports the flexible display, and a first heat dissipating structure disposed between the first component and one end of the hinge housing, thermally coupled to the one end of the hinge housing, and providing a first heat transfer path for transferring heat generated from the first component to the one end of the hinge housing.

According to various embodiments of the disclosure, it is possible transfer heat generated in a housing of a foldable electronic device to the outside due to a heat dissipating structure, thereby providing operational stability of the foldable electronic device and preventing a user from experiencing a burn caused by the heat generation.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

An electronic device according to various embodiments of the disclosure may include at least one of, for example, a smart phone, a tablet personal computer (PC), a mobile phone, a video phone, an e-book reader, a desktop PC, a laptop PC, a netbook computer, a workstation, a server, a personal digital assistant (PDA), a portable multimedia player (PMP), a moving picture experts group phase 1 (MPEG-1) audio layer 3 (MP3) player, a mobile medical device, a camera, and a wearable device (e.g., smart glasses, a head-mounted display (HMD), electronic clothes, an electronic bracelet, an electronic necklace, an electronic appcessory, an electronic tattoo, a smart mirror, or a smart watch).

Figure 1:
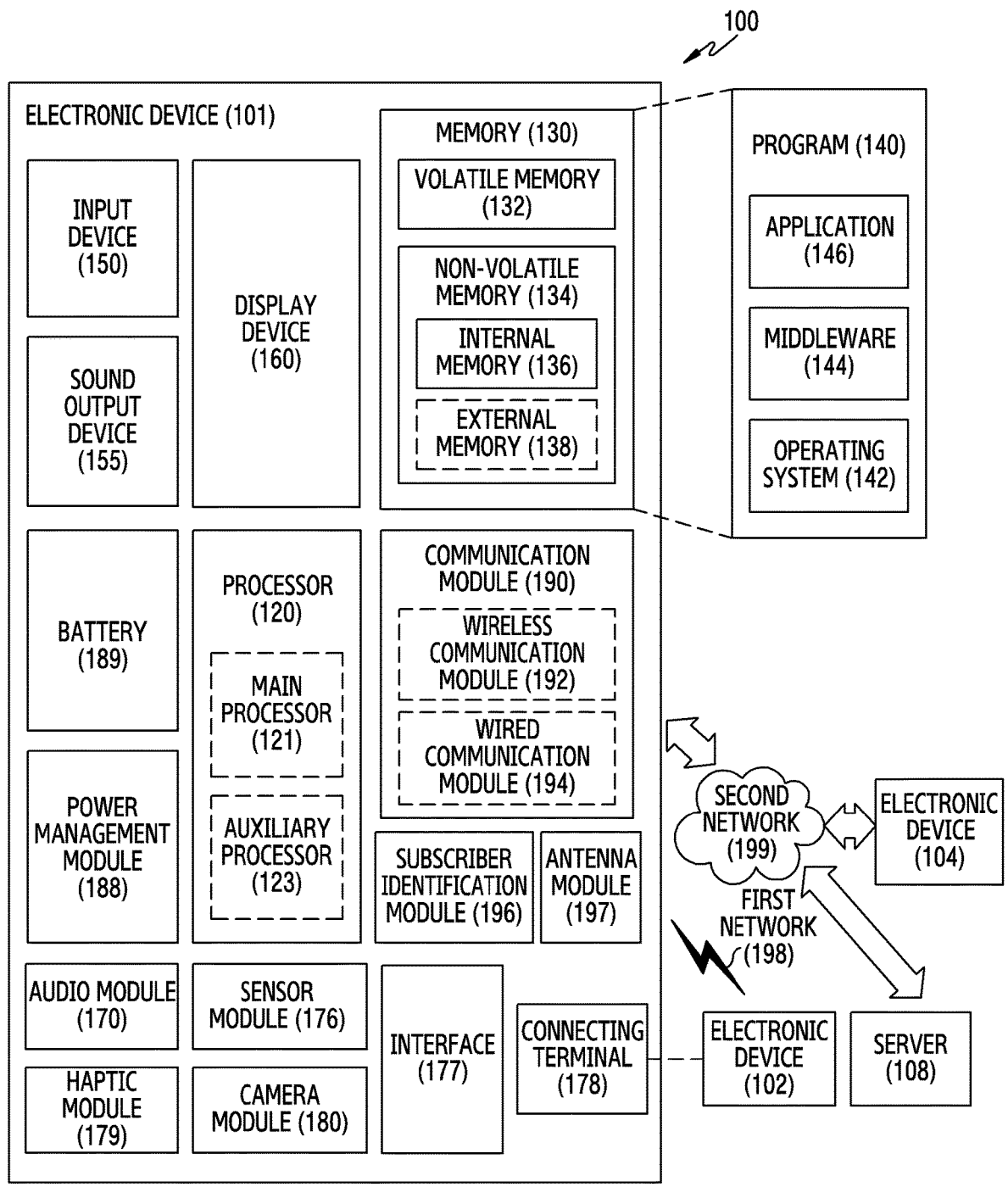
FIG. 1 is a block diagram of an electronic device in a network environment 100 according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments of the disclosure, at least one (e.g., the display device 160 or the camera module 180) of the components may be omitted from the electronic device 101, or one or more other components may be added in the electronic device 101. In some embodiments of the disclosure, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may load a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment of the disclosure, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment of the disclosure, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment of the disclosure, the audio module 170 may obtain the sound via the input device 150, or output the sound via the sound output device 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., PCB). According to an embodiment of the disclosure, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the external electronic devices 102 and 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

Figure 2:
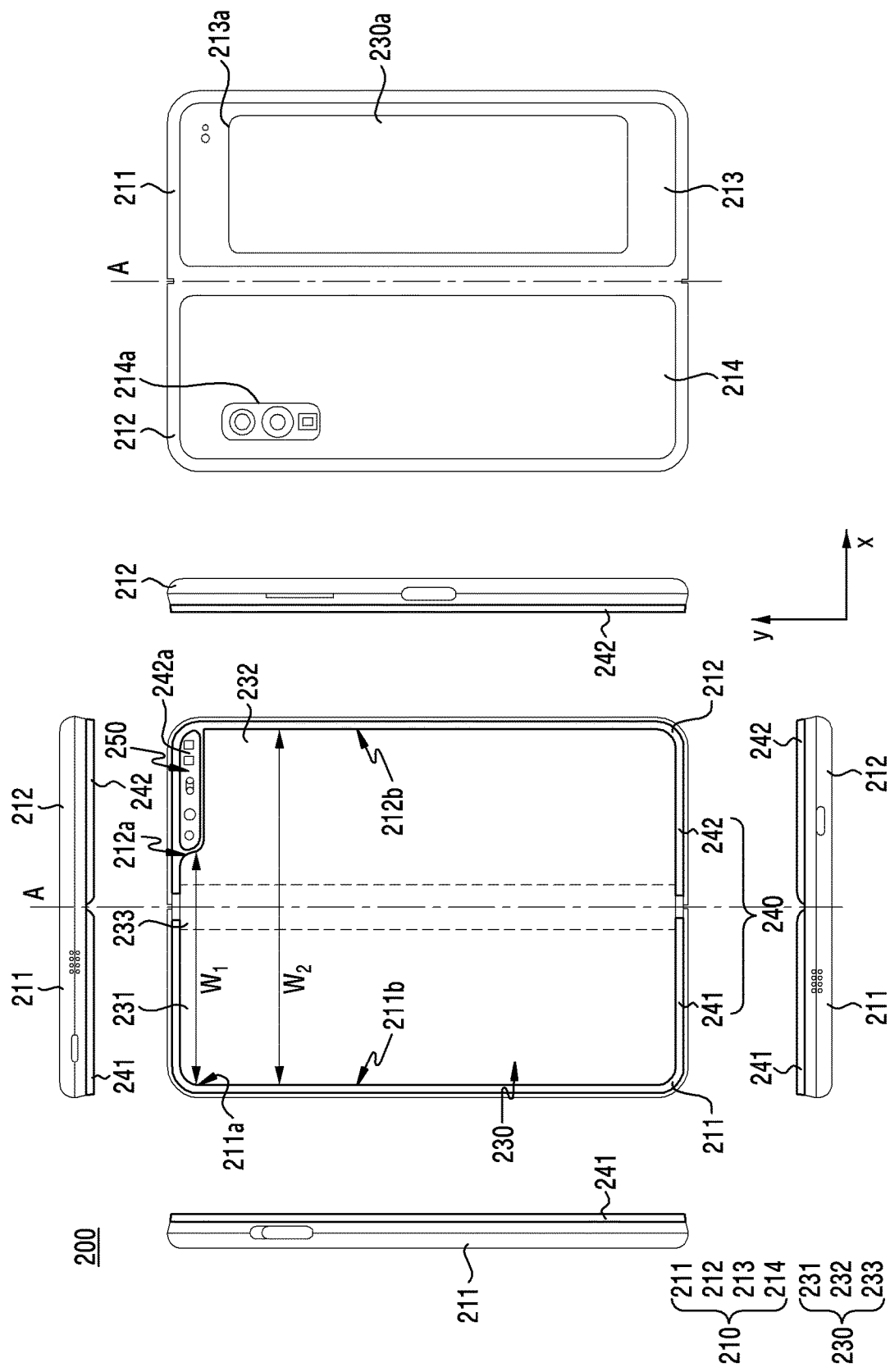
FIG. 2 illustrates an electronic device in an unfolded state according to an embodiment of the disclosure.

FIG. 2 illustrates an electronic device 200 in an unfolded state according to an embodiment of the disclosure.

Figure 3:
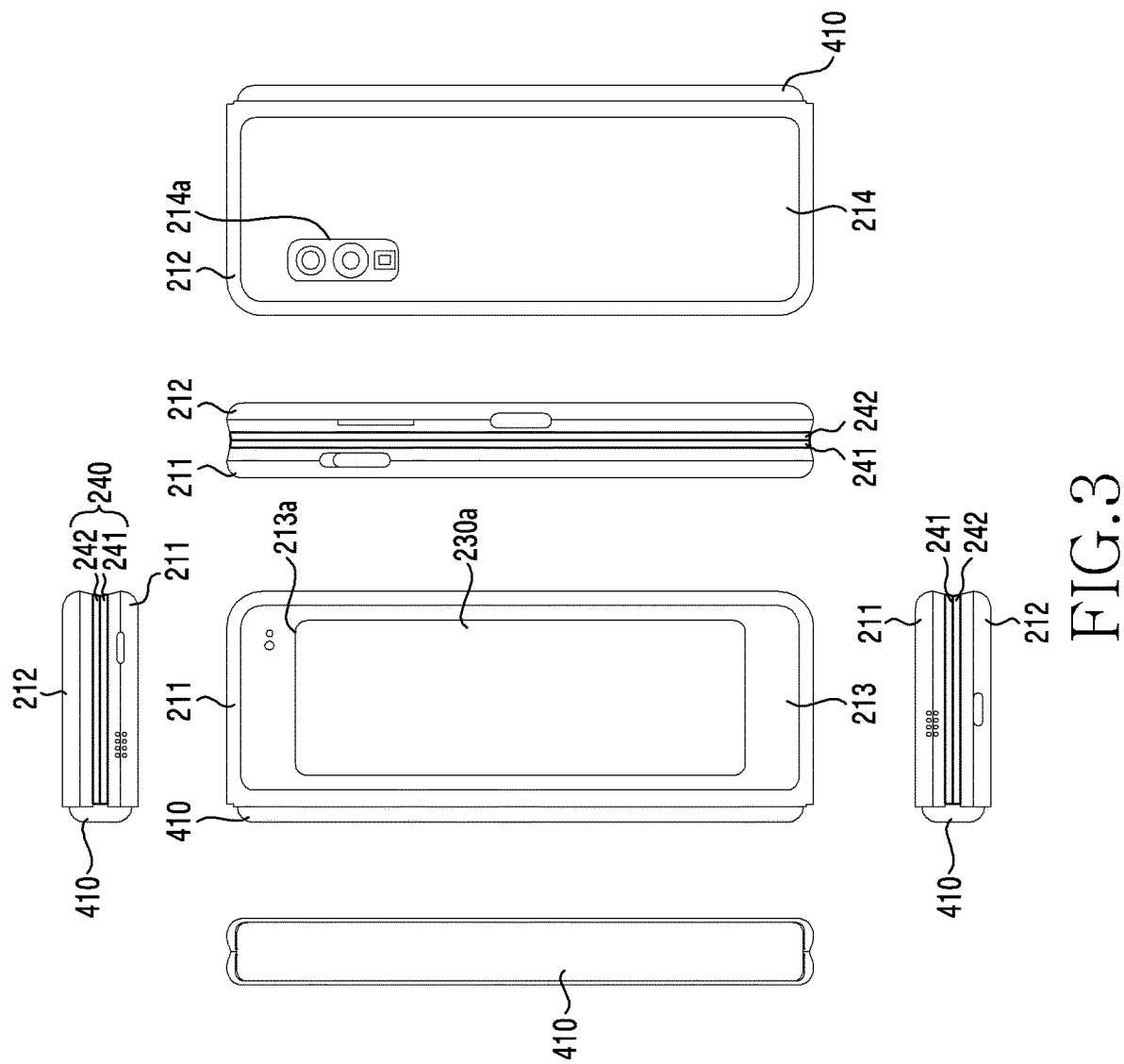
FIG. 3 illustrates an electronic device in a folded state according to an embodiment of the disclosure.

FIG. 3 illustrates the electronic device 200 in a folded state according to an embodiment of the disclosure.

Referring to FIGS. 2 and 3, the electronic device 200 according to an embodiment (e.g., the electronic device 101 of FIG. 1) may include a foldable housing 210, a hinge housing 410 covering a foldable portion of the foldable housing 210, a flexible or foldable display 230 (hereinafter, simply referred to as a "display" 230) disposed inside a space formed by the foldable housing 210, and a protection member 240 disposed on the display 230.

In the disclosure, a face on which the display 230 is disposed is defined as a first face or front face of the electronic device 200. In addition, a face opposed to the front face is defined as a second face or rear face of the electronic device 200, and a face surrounding a space between the front face and the rear face is defined as a third face or side face of the electronic device 200.

The foldable housing 210 according to an embodiment may include a first housing 211, a second housing 212 including a sensor region 250, a first back cover 213, and a second back cover 214. The foldable housing 210 of the electronic device 200 according to various embodiments is not limited to the shape and/or coupling shown in FIGS. 2 and 3, and may be implemented in another shape or in another combination and/or coupling of components. As an example, the first housing 211 and the first back cover 213 may be formed integrally, and the second rear face cover 212 and the second back cover 214 may be formed integrally.

According to an embodiment (e.g., FIGS. 2 and 3), the first housing 211 and the second housing 212 may be disposed at both sides about a folding axis (an axis A), and may have a shape generally symmetric about the folding axis (the axis A). The first housing 211 and the second housing 212 may have different angles and distances which vary depending on whether a state of the electronic device 200 is an unfolded state (or a "flat state") or a folded state or an intermediate state, and detailed descriptions thereof will be described below.

The second housing 212 according to an embodiment may additionally include the sensor region 250 having various sensors disposed therein unlike the first housing 211. However, in a region other than the sensor region 250, the first housing 211 and the second housing 212 may be formed to have a mutually symmetric shape.

As shown in FIG. 2, the first housing 211 and second housing 212 according to an embodiment may also have a recess formed to accommodate the display 230. The recess may have two different widths in a direction perpendicular to the folding axis (the axis A), due to the sensor region 250 disposed to one region of the second housing 211.

As an example, the recess may have a first width w1 between a first portion 211a in the first housing 211, parallel to the folding axis (e.g., the axis A), and a first portion 212a formed at an edge of the sensor region 250 in the second housing 212. As another example, the recess may have a second width w2 formed by a second portion 212b in the first housing 211, parallel to the folding axis (the axis A), and a second portion 212b not belonging to the sensor region 250 in the second region 212 and parallel to the folding axis (the axis A). In this case, the second width w2 may be longer than the first width w1. In other words, the first portion 211a of the first housing 211 and the first portion 212a of the second housing 212, which have a mutually asymmetric shape, may form the first width w1 of the recess, and the second portion 211b of the first housing 211 and the second portion 212b of the second housing 212, which have a mutually symmetric shape, may form the second width w2 of the recess. The first portion 212a and second portion 212b of the second housing 212 may have different distances from the folding axis (the axis A). However, the width of the recess is not limited to the embodiment of FIG. 2. As an example, the recess may have a plurality of widths according to the shape of the sensor region 250 disposed to the second housing structure 212 or a region having the asymmetric shape of the first housing 211 and second housing 212.

According to an embodiment of the disclosure, at least part of the first housing 211 and second housing 212 may be formed of a metal material or non-metal material having a specified magnitude of rigidity to support the display 230.

The sensor region 250 according to an embodiment may be formed adjacent to one corner (e.g., an upper-end corner) of the second housing 212 to have a specific region. However, the arrangement, shape, and/or size of the sensor region 250 are not limited to the embodiment of FIG. 2. As an example, the sensor region 250 may be disposed at another corner (e.g., a lower-end corner) of the second housing 212 or at any region between the upper-end corner and the lower-end corner. Components included in the electronic device 200 to perform various functions may be exposed to the front face of the electronic device 200 through the sensor region 250 or one or more openings prepared in the sensor region 250. According to an embodiment of the disclosure, the aforementioned components may include various types of sensors. The sensor may include, for example, at least one of a front camera, a receiver, and a proximity sensor, but the disclosure is not limited thereto.

The first back cover 213 according to an embodiment may be disposed to one side of the folding axis (the axis A) (e.g., a right side of the axis A) on the rear face of the electronic device 200. The first back cover 213 may have, for example, a substantially rectangular periphery. The periphery may be enclosed by the first housing 211. Similarly, the second back cover 214 according to an embodiment may be disposed to the other side of the folding axis (the axis A) (e.g., a left side of the axis A) on the rear face of the electronic device 200, and a periphery thereof may be enclosed by the second housing 212.

Referring to FIGS. 2 and 3, the first back cover 213 and the second back cover 214 may have a substantially symmetric shape about the folding axis (the axis A). However, the first back cover 213 and the second back cover 214 do not necessarily have a mutually symmetric shape, and thus according to an embodiment of the disclosure, the first back cover 213 and second back cover 214 included in the electronic device 200 may have various shapes. According to another embodiment of the disclosure, the first back cover 213 may be formed integrally with the first housing 211, and the second back cover 214 may be formed integrally with the second housing 212.

According to an embodiment of the disclosure, the first back cover 213, the second back cover 214, the first housing 211, and the second housing 212 may form a space in which various components (e.g., a printed circuit board or a battery) of the electronic device 200 may be disposed. According to an embodiment of the disclosure, one or more components may be disposed or visually exposed on the rear face of the electronic device 200. As an example, at least part of a sub-display 230a may be visually exposed through a first rear region 213a of the first back cover 213. In another embodiment of the disclosure, one or more components or sensors may be disposed or visually exposed through a second rear region 214a of the second back cover 214. In this case, the sensor may include a proximity sensor and/or a rear camera, but the disclosure is not limited thereto.

Referring to FIG. 3, the hinge cover 410 may include a curved face, and may be disposed between the first housing 211 and the second housing 212 to hide a component (e.g., the hinge structure) disposed inside the electronic device 200. The hinge housing 410 according to an embodiment may be hidden by part of the first housing 211 and second housing 212 or may be exposed to the outside of the electronic device 200, according to the state (e.g., the unfolded state or the folded state) of the electronic device 200.

In an example (e.g., see FIG. 2), when the electronic device 200 is in the unfolded state, the hinge housing 410 may not be exposed since it is hidden by the first housing 211 and the second housing 212.

In another example (e.g., see FIG. 3), when the electronic device 200 is in the folded state (e.g., a fully folded state), the hinge housing 410 may be exposed to the outside between the first housing 211 and the second housing 212.

In another example (not shown), in case of the intermediate state in which the first housing 211 and the second housing 212 are folded with a certain angle, the hinge housing 410 may be partially exposed to the outside between the first housing 211 and the second housing 212. However, when the electronic device 200 is in the intermediate tate, a region in which the hinge housing 410 is exposed to the outside of the electronic device 200 may be smaller than that in the fully folded state.

The display 230 according to an embodiment may be disposed on a space formed by the foldable housing 210. As an example, the display 230 may be mounted on the recess formed by the foldable housing 210, and may form most of the front face of the electronic device 200. The display 230 may mean a display in which at least some regions are transformable to a flat face or a curved face.

The display 230 according to an embodiment may include a first region 231 disposed to one side with respect to a folding region 233 (e.g., a left side of the folding region 233 of FIG. 2), and a second region 232 disposed to the other side with respect to the folding region 223 (e.g., a right side of the folding region 233 of FIG. 2). However, a region of the display 230 of FIG. 2 is divided for purposes, and the display 230 may be divided into a plurality of (e.g., at least 2 or 4) regions according to a structure or a function. According to an embodiment (e.g., see FIG. 2), the region of the display 230 may be divided by the folding axis (e.g., the axis A) or the folding region 233 extending parallel to a y-axis. However, regarding the display 230 according to another embodiment of the disclosure, the region of the display 230 may be divided according to another folding region (e.g., a folding region parallel to an x-axis) or another folding axis (e.g., a folding axis parallel to the x-axis).

The first region 231 and the second region 232 may have a shape generally symmetric about the folding region 233. However, unlike the first region 231, the second region 232 may include a cut notch in the presence of the sensor region 250, but may have a shape symmetric to the first region 231 in a region other than the notch region. For example, the first region 231 and the second region 232 may include portions having shapes symmetric to each other and portions having shapes asymmetric to each other.

The protection member 240 according to an embodiment may be attached to at least one region of the foldable housing 210 to protect the display 230 from an external impact. The protection member 240 may be formed along a periphery of the display 230 to prevent the first region 231 and second region 232 of the display 230 from being in in contact when the electronic device 200 is in the folded state.

According to an embodiment of the disclosure, the protection member 240 may include a first protection member 241 formed along some regions of an upper edge of the display 230, a left edge, and some regions of a lower edge, and a second protection member 242 formed along some regions of an upper edge of the display 230, a right edge, and some regions of a lower edge. According to an embodiment of the disclosure, the first protection member 241 and the second protection member 242 may be formed in a "C"-shaped band structure generally, but the disclosure is not limited thereto. In addition, although it is illustrated in FIG. 2 that the protection member 240 includes the first protection member 241 and the second protection member 242, the disclosure is not limited thereto. According to an embodiment of the disclosure, the protection member 240 may include a plurality of (e.g., 4 or 6) protection members.

The first protection member 241 and the second protection member 242 may be disposed at positions spaced apart by a specified distance as shown in FIG. 2. A total length of the display 230 when the electronic device 200 is in the folded state may be shorter than a total length of the display 230 when in the unfolded sate due to the folding region 233. However, the first protection member 241 and the second protection member 242 may be disposed at positions spaced apart by a specified distance to prevent one end of the first protection member 241 from overlapping with one end of the second protection member 242 facing the first protection member 241 when the electronic device 200 is in the folded state.

The first protection member 241 and second protection member 242 according to an embodiment may have a shape generally symmetric about the folding region 233. However, the second protection member 242 may include an exposure region 242a for exposing the sensor region 250 to the outside of the electronic device 200, and the first protection member 241 and the second protection member 242 may have an asymmetrical shape due to the exposure region 242a. The second protection member 242 may have a shape symmetric to the first region 241 in a region other than the exposure region 242a. For example, the first region 241 and the second region 242 may include portions having shapes symmetric to each other and portions having shapes asymmetric to each other.

According to an embodiment of the disclosure, the first protection member 241 may be formed integrally with the first housing 211, and similarly, the second protection member 242 may be formed integrally with the second housing 212. However, the arrangement and/or coupling structure of the first protection member 241 and second protection member 242 are not limited thereto. According to an embodiment of the disclosure, the first protection member 241 and the second protection member 242 may be attached on the display 230 without being coupled to some regions of the first housing 211 and/or second housing 212.

According to the structure described above, the front face of the electronic device 200 may include the display 230, the protection member 240 disposed on the display 230 and formed along the periphery of the display 230, some regions of the first housing 211 adjacent to the display 230, and some regions of the second housing 212. In addition, the rear face of the electronic device 200 may include the first back cover 213, some regions of the first housing 211 adjacent to the first back cover 213, the second back cover 214, and some regions of the second housing 212 adjacent to the second back cover 214.

Hereinafter, an operation of the first housing 211 and second housing 211 according to the state (e.g., the unfolded state and the folded state) of the electronic device 200 and each region of the display 230 will be described.

According to an embodiment (e.g., see FIG. 2), when the electronic device 200 is in the unfolded state, the first housing 211 and the second housing 212 may be disposed to face the same direction with an angle of 180°. A surface of the first region 231 of the display 230 and a surface of the second region 232 may form about 180° to each other, and may face the same direction (e.g., a front direction of the electronic device). The folding region 233 may be coplanar with the first region 231 and the second region 232. In an example, the first protection member 241 may be disposed on a region corresponding to the first region 231 of the display 230, and the second protection member 242 may be disposed on a region corresponding to the second region 232 of the display 230. For example, when the electronic device 200 is in the unfolded state, the first protection member 241 and the second protection member 242 may face the same direction.

According to another embodiment (e.g., see FIG. 3), when the electronic device 200 is in the folded state, the first housing 211 and the second housing 212 may be disposed to face each other. The surface of the first region 231 and the surface of the second region 232 of the display 230 may form a narrow angle (e.g., between 0 degrees and 10 degrees) and may face each other. At least part of the folding region 233 may be a curved face having a specific curvature. The first protection member 241 disposed to a region corresponding to the first region 231 of the display 230 may be in contact with the surface of the second protection member 242 disposed to a region corresponding to the second region 232. In an example, the first region 231 and second region 232 of the display 230 may not be directly in contact due to the first protection member 241 and the second protection member 242. When the first region 231 and the second region 232 are directly in contact, friction may occur between the first region 231 and second region 232 of the display 230 due to an external impact (e.g., a drop). The friction occurring between the first region 231 and the second region 232 may damage the surface of the first region 231 and/or second region 232. On the other hand, the electronic device 200 according to an embodiment may prevent the first region 231 and the second region 232 from being contact with each other through the first protection member 241 and the second protection member 242. As a result, when the electronic device 200 is in the folded state, it is possible to prevent some regions of the display 230 from being damaged due to an external impact.

According to another embodiment (not shown), when the electronic device 200 is in the intermediate state, the first housing 211 and the second housing 212 may be disposed to have a certain angle with each other. In the case above, the first protection member 241 and the second protection member 242 may also be disposed to have a certain angle with each other. The surface of the first region 231 of the display 230 and the surface of the second region 232 may have an angle greater than that in the folded state and less than that in the unfolded state. At least part of the folding region 233 may be formed of a curved face having a certain curvature. In this case, the curvature may be less than that in the folded state.

Although only an embodiment in which the electronic device 200 is vertically folded with respect to a vertical direction (e.g., the y-direction of FIG. 3) has been mentioned above, the disclosure is not limited to the aforementioned embodiment. Although not shown in the drawing, the electronic device 200 according to another embodiment may also be horizontally folded with respect to a virtual folding axis (not shown) extending in a horizontal direction (e.g., the x-direction of FIGS. 2 and 3).

Figure 4:
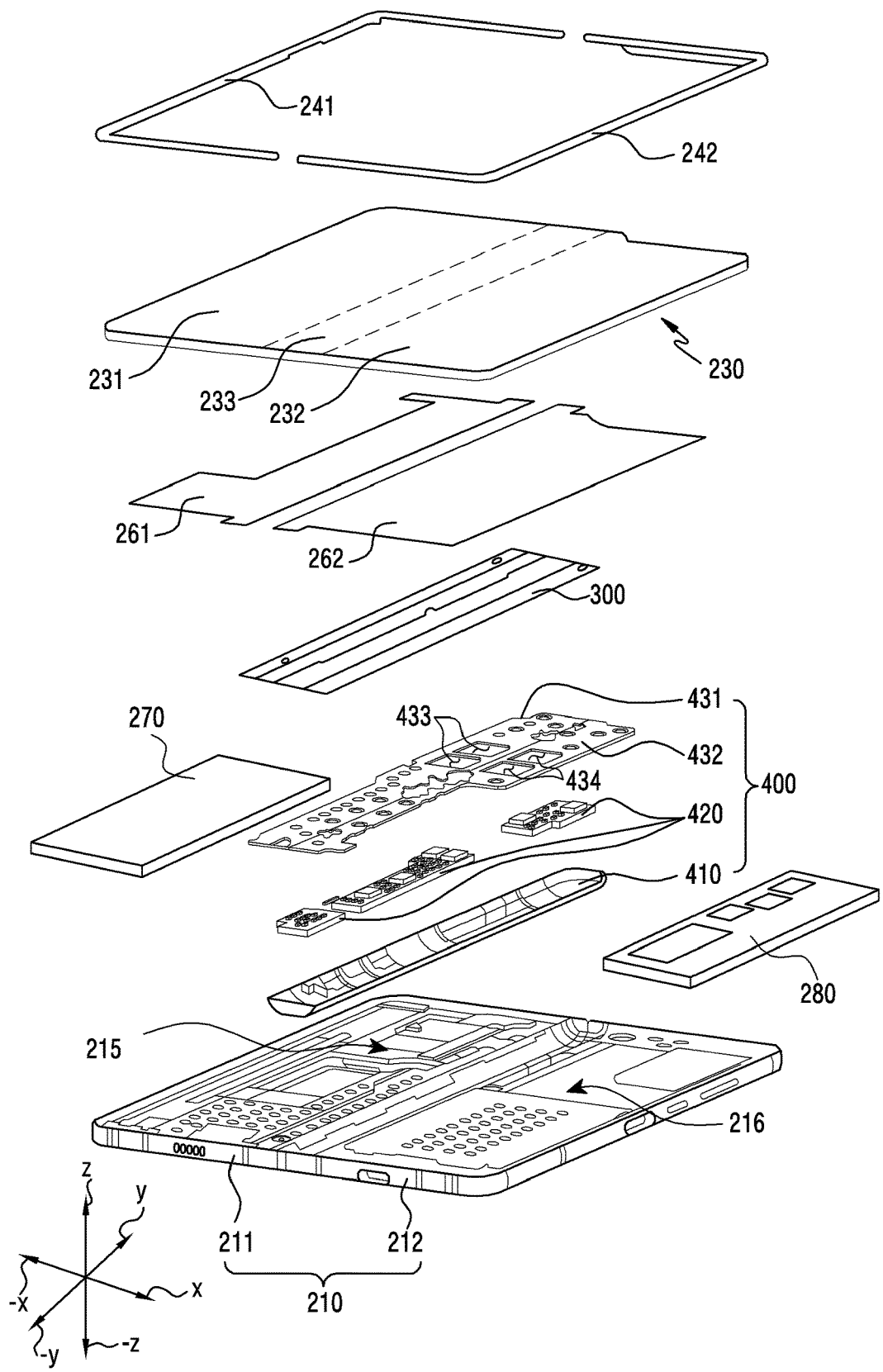
FIG. 4 is an exploded perspective view of an electronic device according to an embodiment of the disclosure.

FIG. 4 is an exploded perspective view of an electronic device according to an embodiment of the disclosure.

Referring to FIG. 4, the electronic device 200 according to an embodiment (e.g., the electronic device 200 of FIGS.

2 and 3) may include a first protection member 241 (e.g., the first protection member 241 of FIG. 2), a second protection member 242 (e.g., the second protection member 242 of FIG. 2), a display 230 (e.g., the display 230 of FIG. 2), a first support plate 261, a second support plate 262, a protection layer 300 (or a "protection sheet"), a first bracket 215, a second bracket 216, a foldable housing 210 (e.g., the foldable housing 210 of FIGS. 2 and 3), and/or a connection structure 400. At least one of the components of the electronic device 200 of FIG. 4 may be the same as or similar to at least one of the components of the electronic device of FIGS. 2 and/or 3, and redundant descriptions will be omitted below.

According to an embodiment of the disclosure, the first protection member 241 and the second protection member 242 may be attached on at least one region of the foldable housing 210 to protect at least one region on an upper face (e.g., a face in a z direction of FIG. 4) of the display 230 from an external impact. According to another embodiment of the disclosure, the first protection member 241 and the second protection member 242 may be integrally formed respectively with the first housing 211 and second housing 212 of the foldable housing 210. In an example, the first protection member 241 may be disposed along a periphery in a left side (e.g., a-x direction of FIG. 4) of the display 230 with respect to a center of the display 230, and the second protection member may be disposed along a periphery in a right side (e.g., an x direction of FIG. 4) of the display 230.

According to an embodiment of the disclosure, the display 230 may be formed of a plurality of layers. The display 230 may include, for example, a protection film layer, a polarization layer, a thin film encapsulation layer, a pixel layer, a Thin Film Transistor (TFT) layer, and/or a cushion layer. The display 230 may emit light from the pixel layer to transfer information to a user, and the light emitted from the pixel layer may be transferred to the outside of the electronic device 200. The display 230 may include a folding region 233, a first region 231 located at a left side (e.g., the -x direction of FIG. 4) with respect to the folding region 233, and a second region 232 located at a right side (e.g., the x direction of FIG. 4) with respect to the folding region 233. The first region 231, the folding region 233, and the second region 232 may be disposed to face the same direction when the electronic device 200 is in the unfolded state. On the contrary, when the electronic device is in the folded state, at least one region of the folding region 233 of the display 230 may be bent, and thus the first region 231 and the second region 232 may be disposed to face each other.

According to an embodiment of the disclosure, the first support plate 261 and the second support plate 262 may be attached to at least one region on a bottom face (e.g., a face in a -z direction of FIG. 4) of the display 230 to support one region of the display 230. In an example, the first support plate 261 may be attached to the first region 231 of the display 230 to support at least one region of the display 230. Similarly, the second support plate 262 may be attached to the second region 232 of the display 230 to support at least one region of the display 230.

In an example, some regions of the first support plate 261 may be attached to the first region 231 of the display 230, and other regions may not be attached to the first region 231 of the display 230. In addition, some regions of the second support plate 262 may be attached to the second region 232 of the display 230, and other regions may not be attached to the second region 232 of the display 230. Through the aforementioned structure, one region of the first support plate 261 and some regions of the second support plate 262 may be spaced apart from the display 230 in a process in which the electronic device 200 rotates from the unfolded state (e.g., see FIG. 2) to the folded state (e.g., see FIG. 3). Accordingly, some regions (e.g., the folding region 233) of the display 230 may be exposed between the first support plate 261 and the second support plate 262 in the process in which the electronic device 200 rotates from the unfolded state (e.g., see FIG. 2) to the folded state (e.g., see FIG. 3). Detailed descriptions thereof will be described below.

According to an embodiment of the disclosure, the first support plate 261 and the second support plate 262 may be formed of a material having a specified rigidity to support at least one region of the display 230. For example, the first support plate 261 and the second support plate 262 may be formed of a metal (e.g., steel use stainless (SUS)) material. However, the disclosure is not limited thereto, and according to another embodiment of the disclosure, the first support plate 261 and the second support plate 262 may be formed of polymer.

According to an embodiment of the disclosure, the protection layer 300 may be located between the first and second support plates 261 and 262 and the connection structure 400. As described above, since the first support plate 251 and some regions of the second support plate 262 are spaced apart from the display 230, a specific space may be formed between the first support plate 261 and the second support plate 262. The protection layer 300 according to an embodiment may prevent external foreign substances (e.g., dust) from entering the aforementioned specific space in the process in which the electronic device 200 rotates from the unfolded state to the folded state. Accordingly, the protection layer 300 may prevent the display 230 from being defective due to the external foreign substances, and detailed descriptions thereof will be described below.

According to an embodiment of the disclosure, the first bracket 215 and the second bracket 216 may be disposed inside the foldable housing 210 to support components (e.g., electronic components) of the electronic device 200. In an example, the first bracket 215 may be disposed inside the first housing 211, and the second bracket 216 may be disposed inside the second housing 212. The first bracket 215 and the second bracket 216 may be disposed respectively inside the first housing 211 and the second housing 212 to prepare a space capable of mounting electronic components (e.g., a wiring member, a printed circuit board) for implementing various functions of the electronic device 200. In addition, the first bracket 215 and the second bracket 216 may support some regions of the display 230 not supported by the first support plate 261 and/or the second support plate 262.

According to an embodiment of the disclosure, the foldable housing 210 may include the first housing 211, the second housing 212, a first back cover (not shown) (e.g., the first back cover 213 of FIG. 2), and a second back cover (not shown) (e.g., the second back cover 214 of FIG. 2). In an example, the foldable housing 210 may form a side face and/or rear face of the electronic device 200. The foldable housing 210 may have a space formed therein, and components (e.g., a battery 270, a printed circuit board 280) of the electronic device 200 may be disposed in the space. In an example, the first back cover may be attached to at least one region of the first housing 211, and the second back cover may be attached to at least one region of the second housing 212. In another example, the first housing 211 and the first back cover may be formed integrally, and the second housing 212 and the second back cover may also be formed integrally.

According to an embodiment of the disclosure, the battery 270 is a device for supplying power to at least one component of the electronic device 200, and may be disposed to a space formed inside the foldable housing 210. The battery 270 may include, for example, a non-rechargeable primary battery, a rechargeable secondary battery, or a fuel cell, but the disclosure is not limited thereto.

According to an embodiment of the disclosure, the printed circuit board 280 may be disposed to the space formed inside the foldable housing 210, and components for implementing various functions of the electronic device 200 may be mounted on the printed circuit board 280. For example, a processor (e.g., the processor 120 of FIG. 1), a communication module (e.g., the communication module 190 of FIG. 1), a memory (e.g., the memory 130 of FIG. 1), or the like may be disposed to the printed circuit board 280.

According to an embodiment of the disclosure, the connection structure 400 may be disposed between the first housing 211 and the second housing 212. The connection structure 400 may rotatably couple the first housing 211 and the second housing 212, and the first housing 211 and the second housing 212 may rotate within a specified rotation angle range through the connection structure 400.

According to an embodiment of the disclosure, the connection structure 400 may be a hinge assembly. The hinge assembly may include, for example, a hinge housing 410 (e.g., the hinge housing 410 of FIG. 3), at least one hinge module 420, a first plate 431, and a second plate 432.

In an example, the hinge housing 410 may be fixed to at least one region of the foldable housing 210 through a fixing member (e.g., a screw). The hinge housing 410 may be disposed between the first housing 211 and the second housing 212 to hide the hinge module 420 disposed inside the hinge housing 410 or protect it from an external impact. The hinge housing 410 according to an embodiment may be hidden by part of the first housing 211 and second housing 212 or may be exposed to the outside of the electronic device 200, according to a state (e.g., an unfolded state or a folded state) of the electronic device 200. In an example (e.g., see FIG. 2), when the electronic device 200 is in the unfolded state, the hinge housing 410 may not be exposed since it is hidden by the first housing 211 and the second housing 212. In another example (e.g., see FIG. 3), when the electronic device 200 is in the folded state (e.g., a fully folded state), the hinge housing 410 may be exposed to the outside between the first housing 211 and the second housing 212.

In an example, the at least one hinge module 420 may rotatably couple the first housing 211 and the second housing 212. The first housing 211 and the second housing 212 may rotate within a specified rotation angle range through the at least one hinge module 420. As a result, the electronic device 200 may rotate from the folded state to the unfolded state, or may rotate from the unfolded state to the folded state. The at least one hinge module 420 may include, for example, a first hinge module which allows the display 230 to be curved or bent along a specified rotational trajectory in the rotation process of the electronic device 200, a second hinge module which assists the rotation of the first housing 211 and second housing 212, and a third hinge module which fixes a motion of the first housing 211 and second housing 212 within a specified rotation angle (e.g., 180°) and/or a specified rotation angle range (e.g., 30° to 60°). However, the disclosure is not limited to the aforementioned embodiment of the disclosure, and according to another embodiment of the disclosure, the at least one hinge module 420 may further include another hinge module other than the first hinge module, the second hinge module, and the third hinge module.

In an example, the first plate 431 and the second plate 432 may be disposed to face the display 230 on the hinge housing 410 to form one face (e.g., a face in a z direction of FIG. 4) of the hinge assembly. The at least one hinge module 420 may be disposed in a space formed by the first plate 431, the second plate 432, and the hinge housing 410. Openings 433 and 434 may be formed in at least one region of the first plate 431 and second plate 432, and the at least one hinge module 420 disposed in the space formed by the first plate 431, the second plate 432, and the hinge housing 410 may be electrically coupled to a printed circuit board and/or battery disposed in the foldable housing 210 through the openings 433 and 434. In an example, an electrical connection member (e.g., a Flexible Printed Circuit Board (FPCB)) electrically coupled to the at least one hinge module 420 may be electrically coupled to the printed circuit board and/or battery disposed inside the foldable housing 210, through the openings 433 and 434 formed at the first and second plates 431 and 432.

Although not shown in the drawing, the connection structure 400 according to another embodiment may be a multi joint structure. In an example, the multi joint structure may include a plurality of joint portions arranged consecutively, and the first housing 211 and the second housing 212 may be rotatably coupled through at least one of the joint portions. In an example, an inclined face (or an inclined portion) may be formed in at least one region of the plurality of joint portions, and the first housing 211 and the second housing 212 may rotate within a specified rotation angle range while the inclined faces formed on the plurality of joint portions are closely in contact with each other. However, a detailed description on an embodiment in which the connection structure 400 is the multi joint structure will be described below.

Figure 5A:
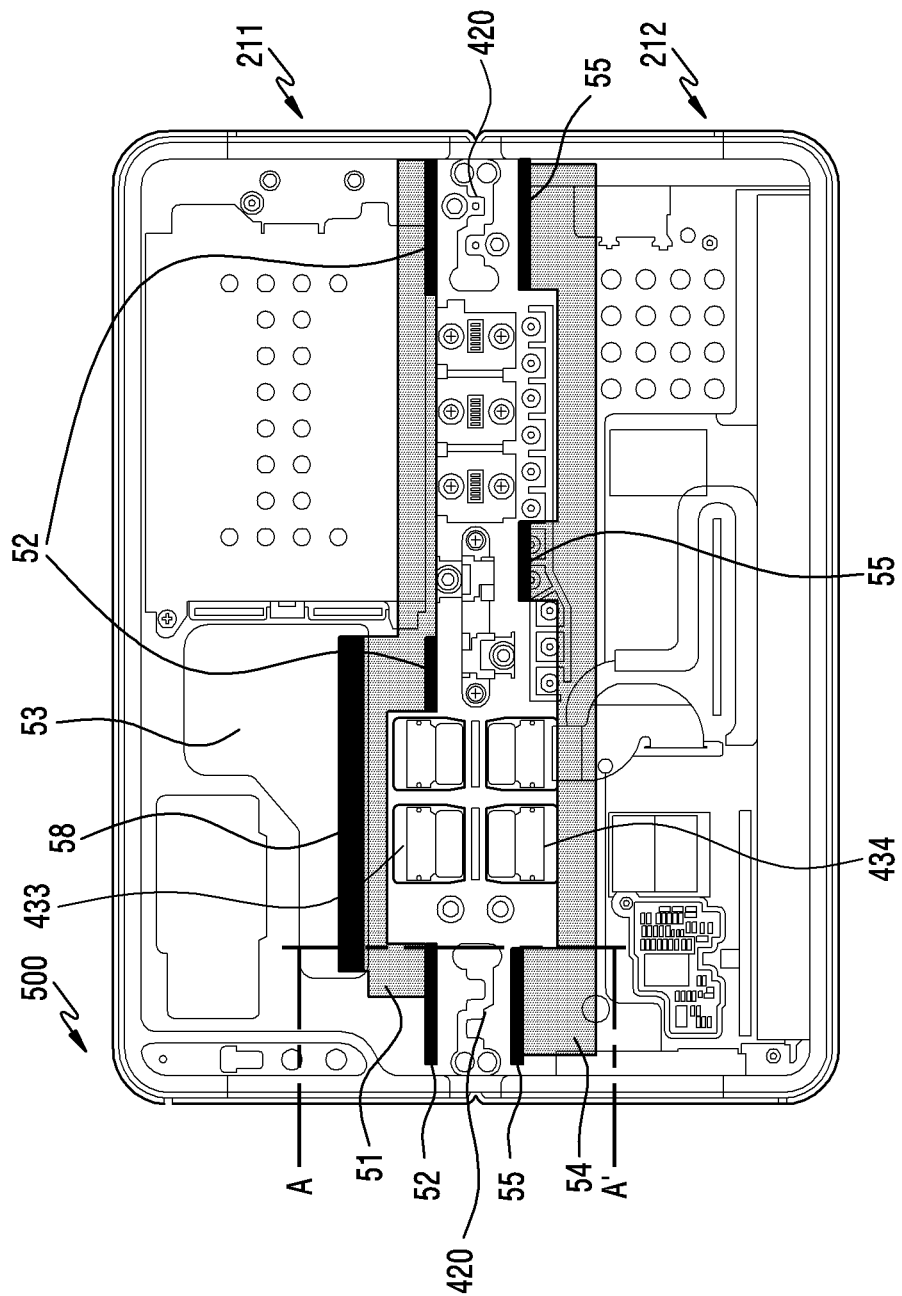
FIG. 5A is a plan view illustrating an electronic device including a heat dissipating structure according to an embodiment of the disclosure.

FIG. 5A is a plan view illustrating an electronic device including a heat dissipating structure according to an embodiment of the disclosure.

Figure 5B:
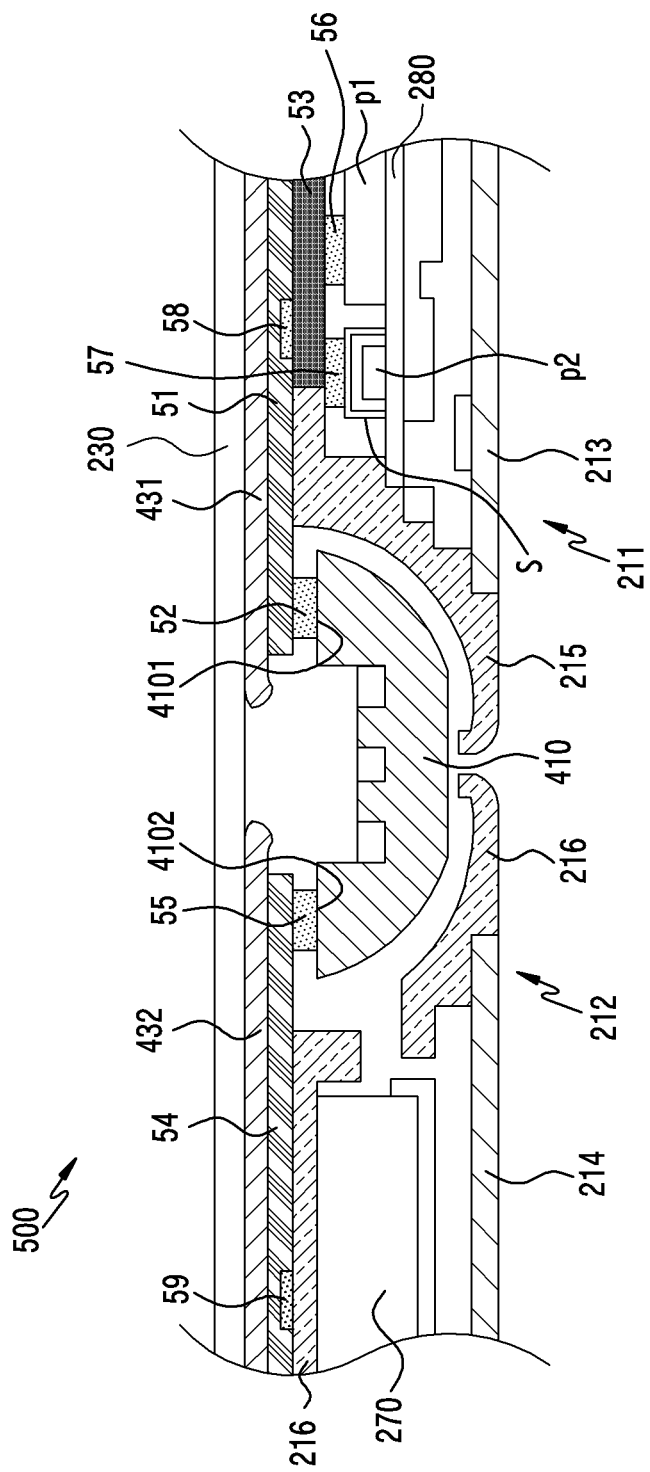
FIG. 5B is a plan cross-sectional view briefly illustrating an electronic device including a heat dissipating structure, cut along the line A-A' of FIG. 5A according to an embodiment of the disclosure.

FIG. 5B is a plan cross-sectional view briefly illustrating an electronic device including a heat dissipating structure, cut along the line A-A' of FIG. 5A according to an embodiment of the disclosure.

Referring to FIGS. 5A and 5B, an electronic device 500 according to an embodiment may be the same electronic device as the electronic device 100 of FIG. 1 or the electronic device 200 of FIGS. 2, 3, and 4.

According to an embodiment of the disclosure, in the electronic device 500, a hinge housing 410 disposed between first and second housings 211 and 212 may be made of a metal material which is a material having an excellent heat transfer rate to transfer heat generated from the first housing 211 to the hinge housing 410, transfer heat generated from the second housing 212 to the hinge housing 410, or transfer heat generated from the first housing 211 to the second housing 212. The heat generated from the second housing 212 may be transferred to the first housing 211. The hinge housing 410 may have a protection member function for protecting the hinge assembly, and a heat transfer member which transfers heat generated from a heating element. For example, the hinge housing 410 may include a lightweight aluminum material among metal materials.

According to an embodiment of the disclosure, the electronic device 500 may include at least one heat dissipating structure. The heat dissipating structure according to an embodiment may transfer heat generated from at least one first heating element, e.g., first and second electronic components p1 and p2, disposed to the first housing 211, to the hinge housing 410, or may radiate heat generated from at least one second heating element, e.g., a battery 270, disposed to the second housing 212, towards the hinge housing 410, or may radiate heat generated from the first and second electronic components p1 and p2 towards the second housing 212. According to an embodiment of the disclosure, the heat dissipating structure may include a heat dissipating structure providing a first heat transfer path which transfers the heat generated from the first and second electronic components p1 and p2 to the hinge housing 410, and a second heat dissipating structure providing a second heat transfer path which transfers from the second housing 212 the heat transferred to the hinge housing 410.

According to an embodiment of the disclosure, the first heat heating element may include a first printed circuit board 280 and at least one or more first and second electronic components p1 and p2 disposed on the first printed circuit board 280. For example, the first and second electronic components p1 and p2 may be one or more of an application processor (AP) (e.g., the processor 120), a central processing unit (CPU) (e.g., the processor 120), and a radio frequency (RF) unit (e.g., the communication module 190).

According to an embodiment of the disclosure, the first heat dissipating structure may be disposed between the first and second electronic components p1 and p2 and the hinge housing 410, and may be stacked between a first plate 431 and a first back cover 213. According to an embodiment of the disclosure, the first heat dissipating structure may include at least one or more heat transfer members 51, 52, and 53 or Thermal Interfacing Materials (TIMs) 56, 57, and 58. According to an embodiment of the disclosure, the heat transfer member may include the first heat transfer member 51 which transfers heat generated from the first and second electronic components p1 and p2 to the hinge housing 410. According to an embodiment of the disclosure, the first heat transfer member 51 may be disposed to overlap and face at least some regions of the first plate 431. For example, the first heat transfer member 51 may include any one of a copper sheet, a copper plate, and a graphite sheet.

According to an embodiment of the disclosure, the first heat transfer member 51 may be thermally coupled to the first and second electronic components p1 and p2 by using the third heat transfer member 53, the first TIM 56, the second TIM 57, or the third TIM 58, and may transfer heat generated from the first and second electronic components p1 and p2 to the hinge housing 410. Being thermally coupled may imply that a heat transfer path is formed.

According to an embodiment of the disclosure, the first heat dissipating structure may include the second heat transfer member 52. According to an embodiment of the disclosure, the second heat transfer member 52 may be disposed between the first heat transfer member 51 and the hinge housing 410 and may be thermally coupled in part to each of the first heat transfer member 51 and the hinge housing 410. According to an embodiment of the disclosure, the second heat transfer member 52 may transfer heat transferred from the first heat transfer member 51 to one end 4101 of the hinge housing 410. For example, the second heat transfer member 52 may include a heat transfer tape or a thermal interfacing material (TIM). For example, part of the first heat transfer member 51, the second heat transfer member 52, and one end of the hinge housing 410 may be disposed to be stacked with one another.

According to an embodiment of the disclosure, the first heat transfer member 51 may include the third heat transfer member 53 thermally coupled. The third heat transfer member 53 may be disposed between the first electronic components p1 and p2 and the first heat transfer member 51 to transfer heat generated from the first electronic components p1 and p2 to the first heat transfer member 51. For example, the third heat transfer member 53 may include any one of a vapor chamber and a heat pipe.

According to an embodiment of the disclosure, the first TIM 56 may be disposed between the third heat transfer member 53 and the first electronic component p1. For example, the first TIM 56 may have a gap between the third heat transfer member 53 and the first electronic component p1, and the first TIM 56 may be disposed in a gap filling manner. The TIM 56 may transfer heat generated from the first electronic component p1 to the third heat transfer member 53, and may include an adhesive function and a support function. For example, the first TIM 56 may include a double-sided heat transfer tape.

According to an embodiment of the disclosure, the second TIM 57 may be further disposed between the third heat transfer member 53 and the second electronic component p2. For example, the second electronic component p2 may include a shield can s for shielding electromagnetic waves, and may include an RF unit (e.g., the communication module 190) disposed to an inner space of the shield can s. According to an embodiment of the disclosure, the second Tim 57 may transfer heat generated from the shield can s to the third heat transfer member 53. According to an embodiment of the disclosure, the first heat transfer member 51 may be thermally coupled to the first electronic component p1 or the second electronic component p2 through the first and second TIMs 56 and 57 without the third heat transfer member 53. For example, the second TIM 57 may include a double-sided heat transfer tape.

According to an embodiment of the disclosure, the third TIM 58 may be additionally disposed between the first heat transfer member 51 and the third heat transfer member 53. According to an embodiment of the disclosure, the third TIM 58 may be thermally coupled to each of the first heat transfer member 51 and the third heat transfer member 53. The third TIM 58 may transfer heat transferred to the third thermal transfer member 53 to the first heat transfer member 51, and may allow the first and third heat transfer members 51 and 53 to be adhered to each other. For example, the third TIM 58 may include a double-sided heat transfer tape.

Figure 6:
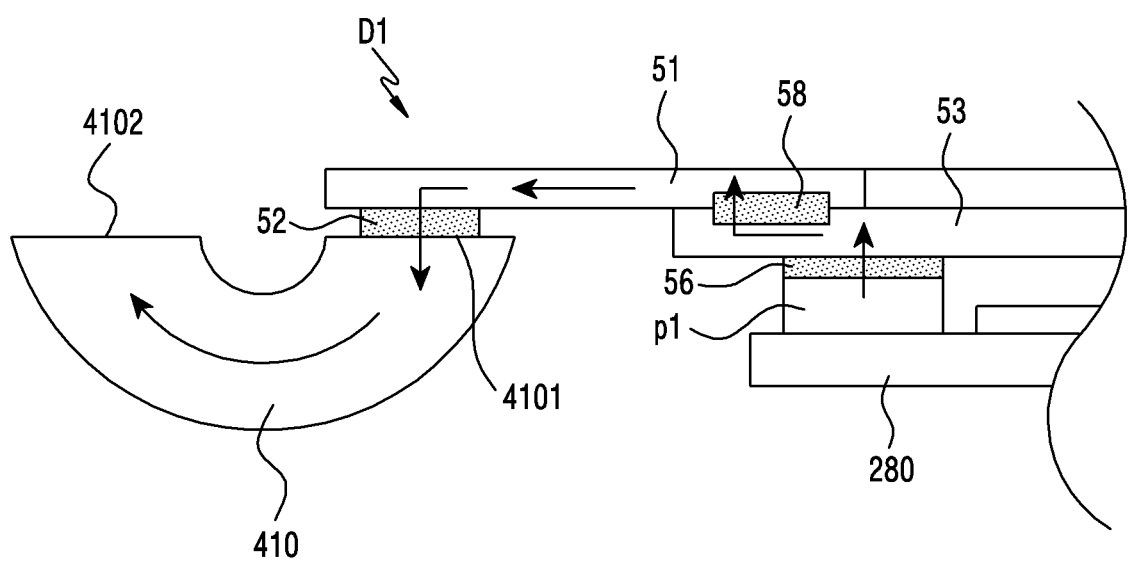
FIG. 6 briefly illustrates an example of a first heat dissipating structure providing a first heat transfer path according to an embodiment of the disclosure.

FIG. 6 briefly illustrates an example of a first heat dissipating structure providing a first heat transfer path according to an embodiment of the disclosure.

Referring to FIG. 6, the first heat transfer path provided by a first heat dissipating structure D1 according to an embodiment is as follows. According to an embodiment of the disclosure, regarding the first heat transfer path, heat generated from the first electronic component p1 may flow to the first TIM 56, the third heat transfer member 53, the third TIM 58, and the first heat transfer member 51, and the second heat transfer member 52, in that order, and may be transferred to the one end 4101 of the hinge housing 410. The heat transferred to the one end 4101 of the hinge housing 410 may be transferred to the other end 4102 of the hinge housing 410. Finally, part of the heat transferred to the one end 4101 of the hinge housing 410 may be transferred to the second housing 212, and the remaining parts may be radiated to the outside through the hinge housing 410.

Referring to FIG. 5A again, the heat transferred to the other end 4102 of the hinge housing 410 according to an embodiment may be transferred towards the second housing 212 by means of the second heat dissipating structure.

According to an embodiment of the disclosure, the second heat dissipating structure may include a fourth heat transfer member 54 disposed between a second plate 432 and the other end 4102 of the hinge housing 410. According to an embodiment of the disclosure, the second heat dissipating structure may include a fifth heat transfer member 55 between the fourth heat transfer member 54 and the other end 4102 of the hinge housing 410. According to an embodiment of the disclosure, the second heat dissipating structure may include a fourth TIM 59 between the fourth heat transfer member 54 and the second bracket 216. According to an embodiment of the disclosure, the fourth heat transfer member 54 may transfer the heat transferred from the other end 4102 of the hinge housing 410 to the second bracket 216 or the heat transfer member disposed to the second hinge housing 410.

According to an embodiment of the disclosure, the fifth heat transfer member 55 may be included between the fourth heat transfer member 54 and the other end 4102 of the hinge housing 410. According to an embodiment of the disclosure, the fifth heat transfer member 55 may be thermally coupled to each of the fourth heat transfer member 43 and the other end 4102 of the hinge housing 410. According to an embodiment of the disclosure, the fifth heat transfer member 55 is a TIM or a double-sided heat transfer tape, and may be disposed in plurality along the other end 4102 of the hinge housing 410.

According to an embodiment of the disclosure, the fourth TIM 59 may be further disposed between the fourth heat transfer member 54 and the second bracket 216. According to an embodiment of the disclosure, the fourth TIM 59 may be thermally coupled to the fourth heat transfer member 54 and the second bracket 216, and may be attached to the fourth heat transfer member 54 and the second bracket 216. For example, the fourth TIM 59 may include a double-sided heat transfer tape.

Figure 7:
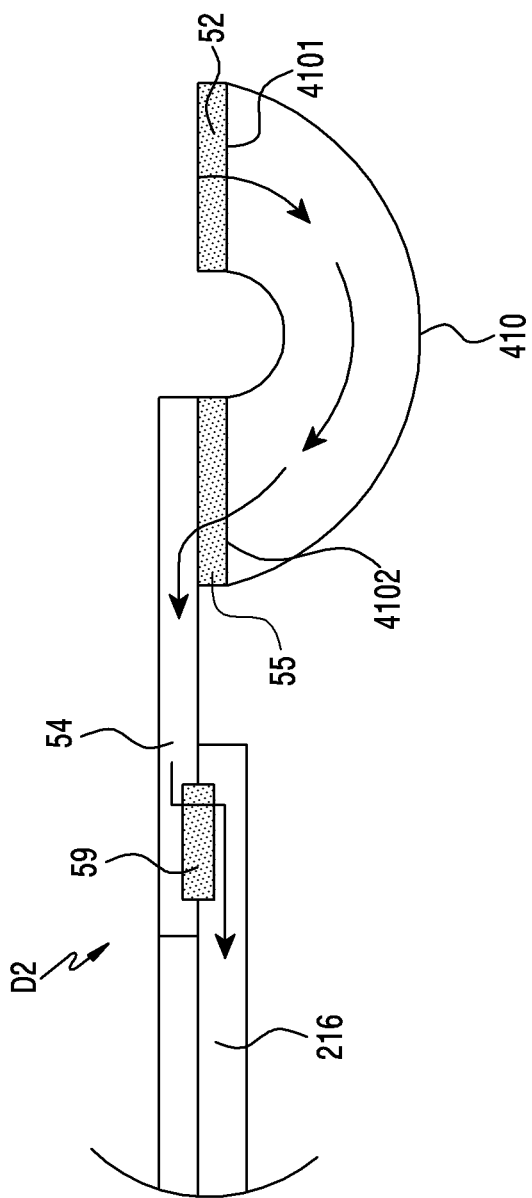
FIG. 7 briefly illustrates an example of a second heat dissipating structure providing a second heat transfer path according to an embodiment of the disclosure.

FIG. 7 briefly illustrates an example of a second heat dissipating structure providing a second heat transfer path according to an embodiment of the disclosure.

Referring to FIG. 7, a second heat transfer path provided by a second heat dissipating structure D2 according to an embodiment is as follows. According to an embodiment of the disclosure, regarding the second heat transfer path, heat transferred from the one end 4101 of the hinge housing 410 may be transferred to the other end 4102 of the hinge housing 410, the fifth heat transfer member 55, the fourth heat transfer member 54, and the fourth TIM 59, and the second bracket 216, in that order. The second bracket 216 may be replaced with another heat transfer member.

Figure 8A:
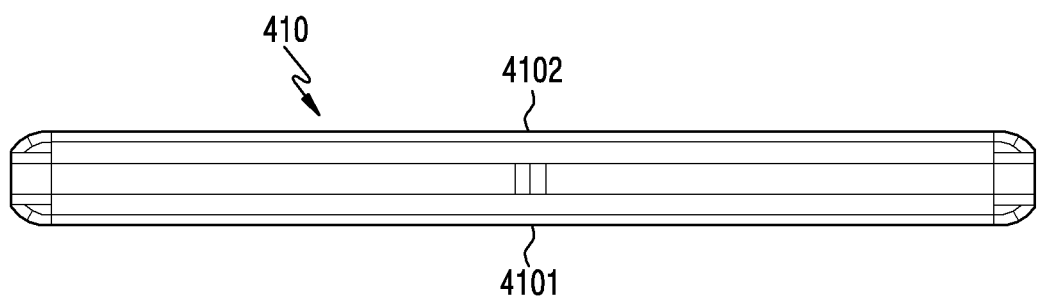
FIG. 8A is a front view illustrating a hinge housing according to an embodiment of the disclosure.

FIG. 8A is a front view illustrating a hinge housing according to an embodiment of the disclosure.

Figure 8B:
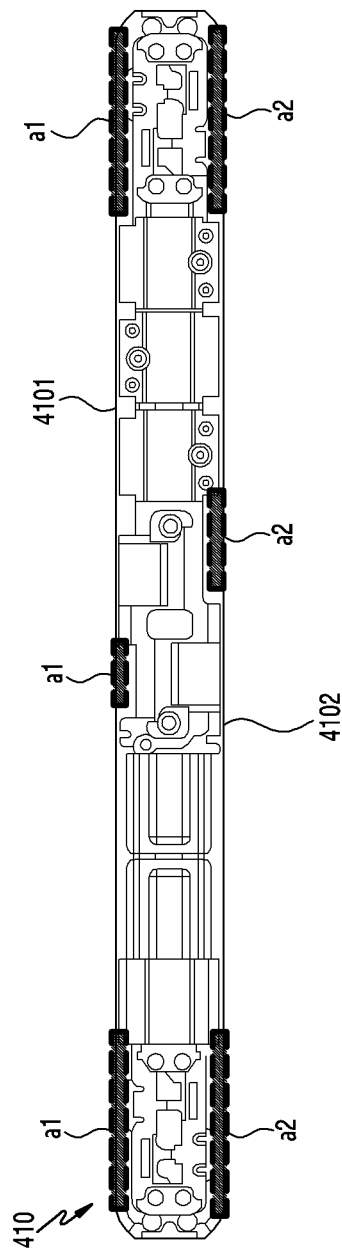
FIG. 8B is a rear view illustrating a hinge housing according to an embodiment of the disclosure.

FIG. 8B is a rear view illustrating a hinge housing according to an embodiment of the disclosure.

Referring to FIGS. 8A and 8B, the hinge housing 410 according to an embodiment may have a C-shaped cross section, may be exposed or hidden according to whether the electronic device 500 is folded/unfolded, and may be a cover for protecting a hinge assembly (e.g., the hinge module 420 of FIG. 4). According to an embodiment of the disclosure, the hinge housing 410 is made of a metal material, and may be at least in part or entirely made of the metal material. According to an embodiment of the disclosure, the hinge housing 410 may be disposed between the first and second housings 211 and 212, and may include the one end 4101 coupled to the first housing 211 and the other end 4102 facing the one end 4101 and coupled to the second housing. According to an embodiment of the disclosure, the one end 4101 and the other end 4102 of the hinge housing 410 may include a plurality of first and second regions a1 and a2 respectively so that the second heat transfer member 52 and the fifth neat transfer member 55 are disposed, respectively.

According to an embodiment of the disclosure, the second heat transfer member 52 may have the plurality of first regions a1 disposed along the one end 4101, and the fifth heat transfer member 55 may have the plurality of second regions a2 disposed along the other end 4102. According to an embodiment of the disclosure, the first regions a1 may be disposed with an interval, and the second regions a2 may also be disposed with an interval. For example, each of the first regions a1 or the second regions a2 may be a flat region.

Figure 9A:
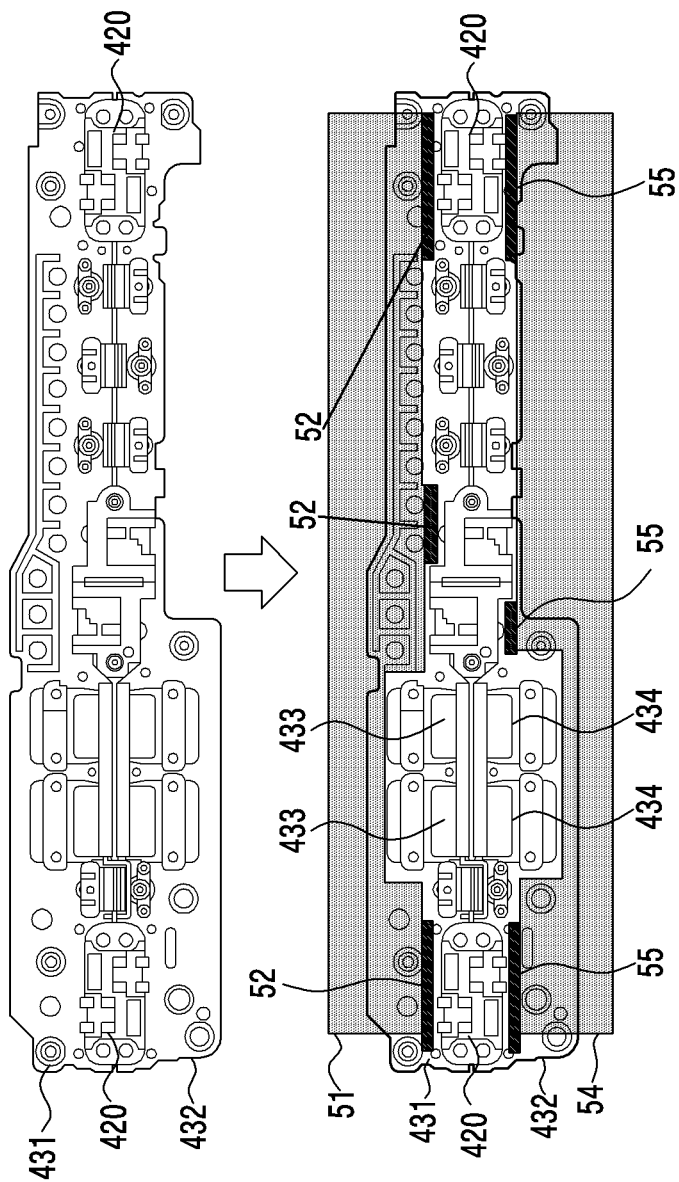
FIG. 9A is a plan view illustrating states before and after first and fourth heat transfer members are mounted on first and second plates according to an embodiment of the disclosure.

FIG. 9A is a plan view illustrating states before and after first and fourth heat transfer members are mounted on first and second plates according to an embodiment of the disclosure.

Figure 9B:
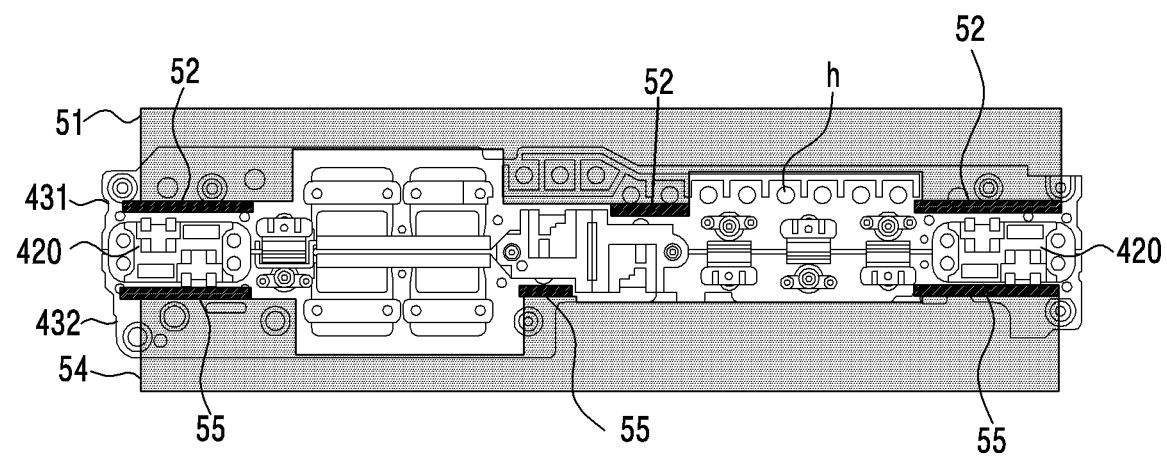
FIG. 9B is a plan view illustrating a state where first and fourth heat transfer members are mounted on first and second plates according to an embodiment of the disclosure.

FIG. 9B is a plan view illustrating a state where first and fourth heat transfer members are mounted on first and second plates according to an embodiment of the disclosure.

Referring to FIG. 9A, a heat dissipating structure according to an embodiment may include a first heat transfer member 51 disposed to face a first plate 431, and a fourth heat transfer member 54 disposed to face a second plate 432. The first heat transfer member 51 of FIG. 9A may have the same structure as the first heat transfer member 51 of FIGS. 5A and 5B, and the fourth heat transfer member 54 may have the same structure as the fourth heat transfer member 54 of FIGS. 5A and 5B. In FIG. 9A, the first and second plates 431 and 432 at an upper portion are shown in a state before the first and fourth heat transfer members are combined, and the first and second plates 431 and 432 at a lower portion are shown in a state where the first and fourth heat transfer members are coupled.

According to an embodiment of the disclosure, the first heat transfer member 51 may have an area sufficient to substantially cover the first plate 431, and may be removed in a region of a first opening 433 through which an FPCB passes. According to an embodiment of the disclosure, the plurality of second heat transfer members 52 may be attached with an interval at one end of the first heat transfer member 51.

According to an embodiment of the disclosure, the fourth heat transfer member 54 may have an area sufficient to substantially cover the second plate 432, and may be removed in a region of a second opening 434 through which an FPCB passes. According to an embodiment of the disclosure, a plurality of fifth heat transfer members may be attached with an interval at one end of the fourth heat transfer member 54.

Referring to FIG. 9B, the first heat transfer member 51 according to an embodiment may have a structure which differs in part from the first heat transfer member 51 of FIG. 9A. For example, part of the first heat transfer member 51 may be additionally removed in a portion corresponding to one portion of a plurality of holes h formed on the first plate 431.

Figure 10:
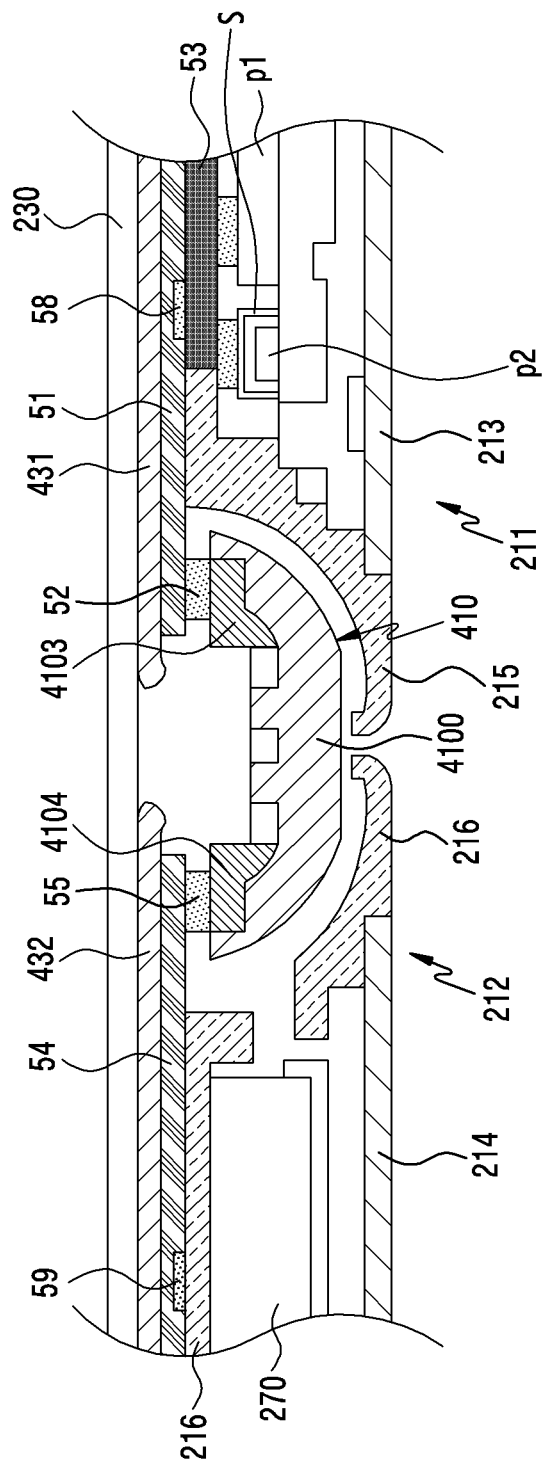
FIG. 10 is a cross-sectional view illustrating an electronic device including a heat dissipating structure according to an embodiment of the disclosure.

FIG. 10 is a cross-sectional view illustrating an electronic device including a heat dissipating structure according to an embodiment of the disclosure.

Referring to FIG. 10, a hinge housing 410 according to an embodiment may be formed by combining at least two materials. For example, the hinge housing 410 may be formed mostly of a synthetic resin portion 4100. A first portion 4103 in contact with a second heat transfer member 52 and a second portion 4104 in contact with a fourth heat transfer member 54 may be formed of a material having a high heat transfer rate. For example, a material having a high heat transfer rate may include an aluminum material.

Figure 11A:
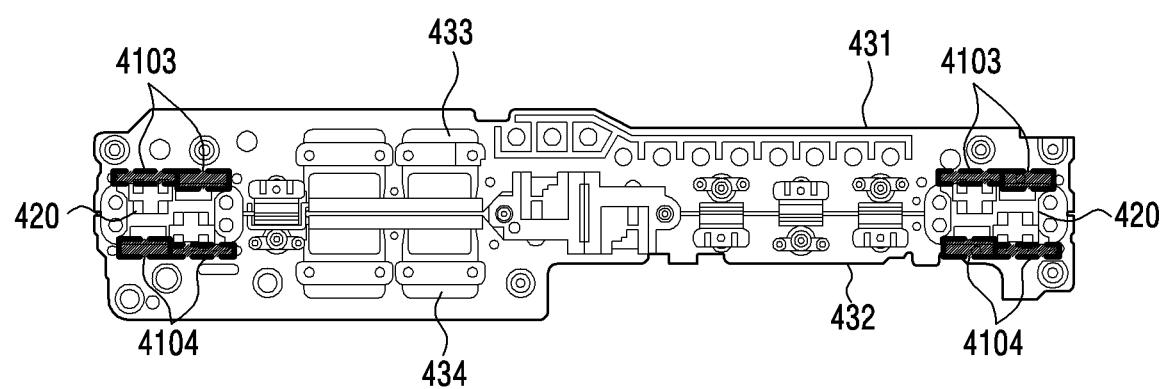
FIG. 11A is a plan view illustrating first and second plates according to an embodiment of the disclosure.

FIG. 11A is a plan view illustrating first and second plates according to an embodiment of the disclosure.

Figure 11B:
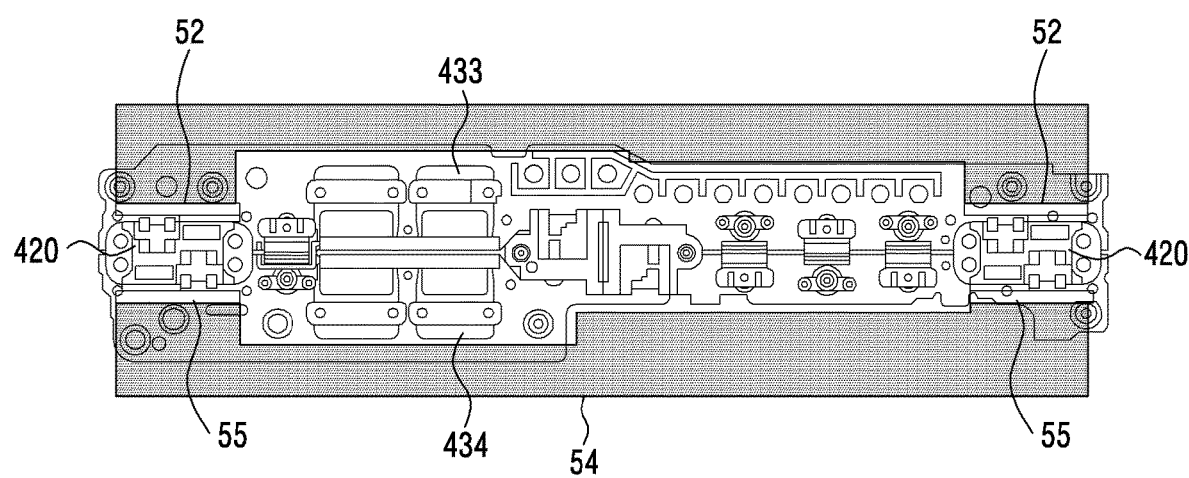
FIG. 11B is a plan view illustrating a state where first and fourth heat transfer members are disposed respectively to first and second plates according to an embodiment of the disclosure.

FIG. 11B is a plan view illustrating a state where first and fourth heat transfer members are disposed respectively to first and second plates according to an embodiment of the disclosure.

Referring to FIGS. 11A and 11B, according to an embodiment of the disclosure, when first and second plates 431 and 432 are viewed from above a foldable display 230, at least one first portion 4103 may be formed in both end regions of the first plate 431 along a lengthwise direction of a hinge housing 410, and at least one second portion 4104 may be formed in both end regions of the second plate 431 along a lengthwise direction of the hinge housing 410.

According to an embodiment of the disclosure, heat may be transferred to the first portion 4103 from a second heat transfer member 52, and heat may be transferred to the second portion 4104 from a fourth heat transfer member 54.

Figure 12:
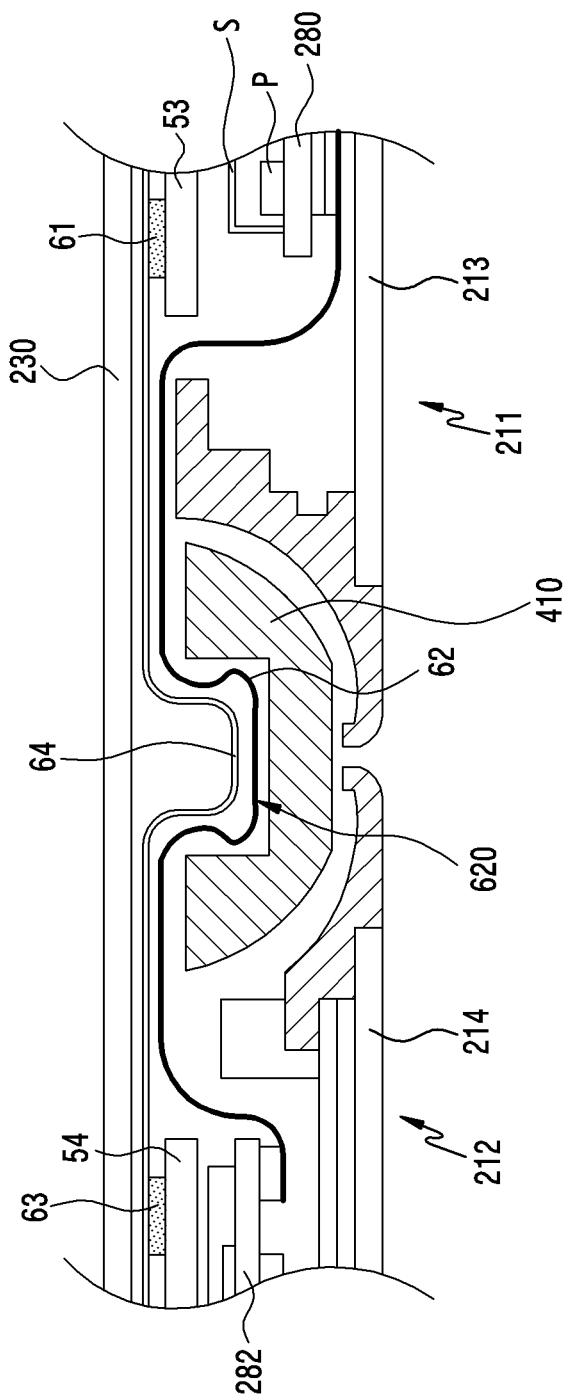
FIG. 12 is a cross-sectional view illustrating a state where a heat transfer sheet is mounted according to an embodiment of the disclosure.

FIG. 12 is a cross-sectional view illustrating a state where a heat transfer sheet is mounted according to an embodiment of the disclosure.

Figure 13A:
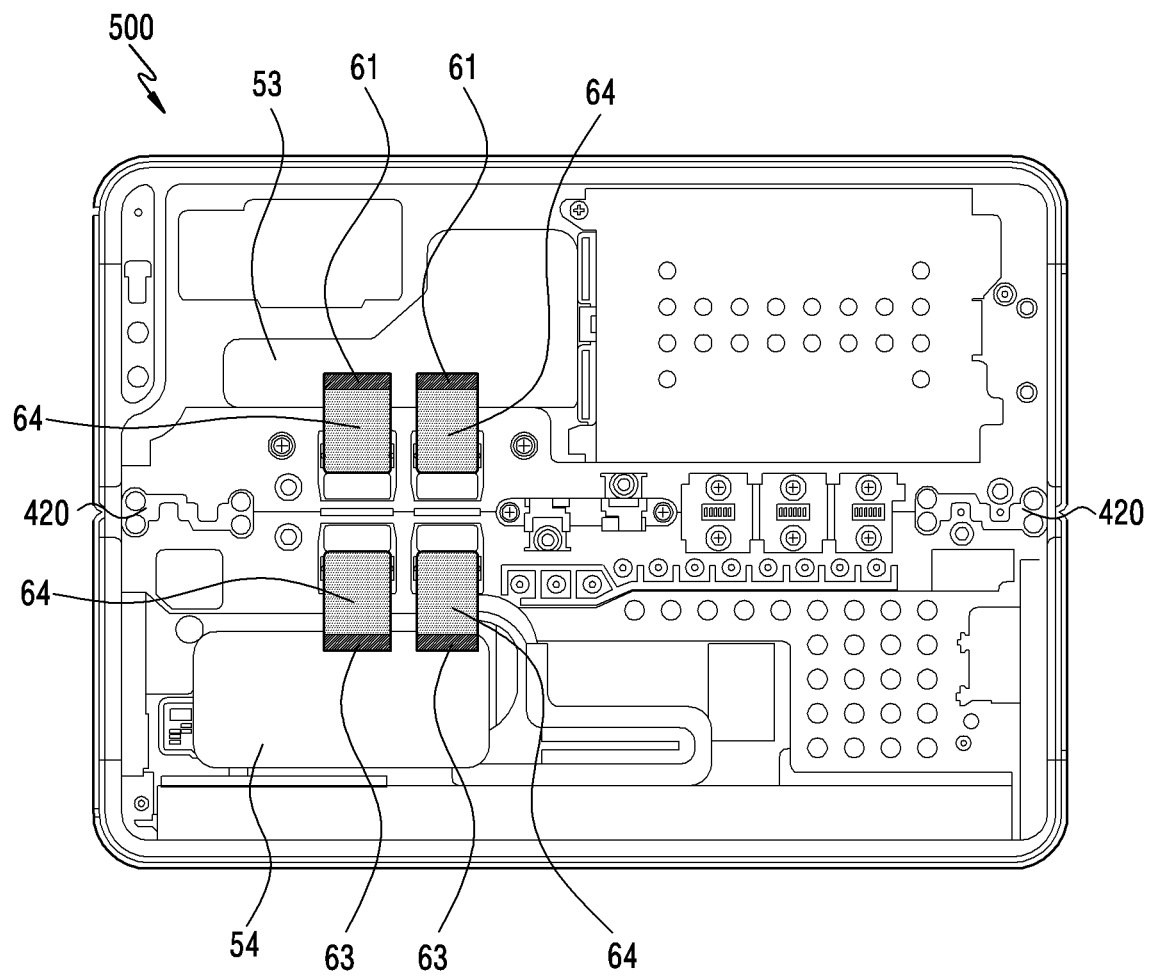
FIG. 13A is a plan view illustrating a state where a heat transfer sheet is mounted on an electronic device according to an embodiment of the disclosure.

FIG. 13A is a plan view illustrating a state where a heat transfer sheet is mounted on an electronic device according to an embodiment of the disclosure.

Figure 13B:
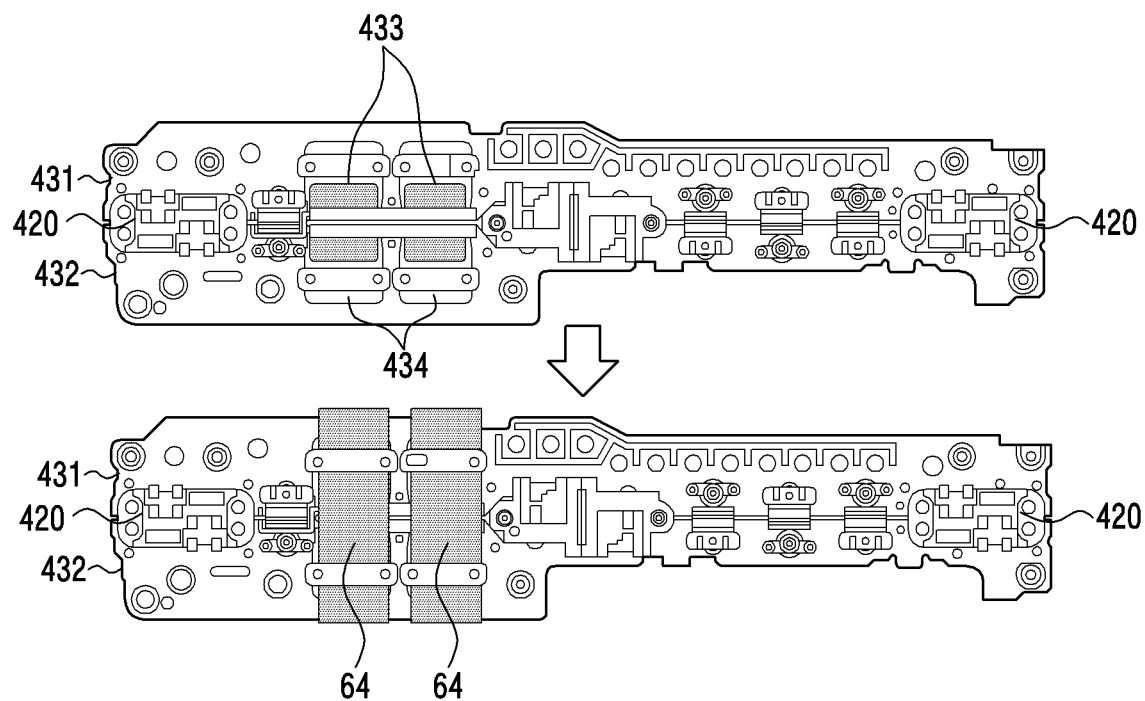
FIG. 13B is a plan view illustrating a state where a heat transfer sheet is disposed to first and second plates according to an embodiment of the disclosure.

FIG. 13B is a plan view illustrating a state where a heat transfer sheet is disposed to first and second plates according to an embodiment of the disclosure.

Referring to FIGS. 12, 13A, and 13B, a heat transfer sheet (or a thermal sheet) 64 according to an embodiment may be disposed along a connection structure through which a flexible printed circuit board (FPCB) 62 passes. According to an embodiment of the disclosure, the heat transfer sheet 64 may share a path through which the FPCB 62 passes. According to an embodiment of the disclosure, the FPCB 62 may be an electrical coupling member which electrically couples a first PCB 280 disposed to a first housing 211 and a second PCB 282 disposed to a second housing 212. For example, the heat transfer sheet 64 may be a graphite sheet.

According to an embodiment of the disclosure, the heat transfer sheet 64 may be disposed to face the FPCB 62 so that heat generated from a first electronic component p disposed to the first PCB 280 is transferred towards a fourth heat transfer member 54 disposed to the second housing 212. According to an embodiment of the disclosure, the heat transfer sheet 64 may have the same width size as the FPCB 62, and may be disposed to a folding portion 620 of the FPCB 62.

According to an embodiment of the disclosure, one end of the heat transfer sheet 64 may be thermally coupled to a third heat transfer member 53 by means of a TIM 61, and the other end may be thermally coupled to the third heat transfer member 54 by means of a TIM 63. For example, heat generated from the first PCB 280 may be transferred towards the fourth heat transfer member 54 through the TIM 61, the third heat transfer member 53, and the heat transfer sheet 64.

Figure 14:
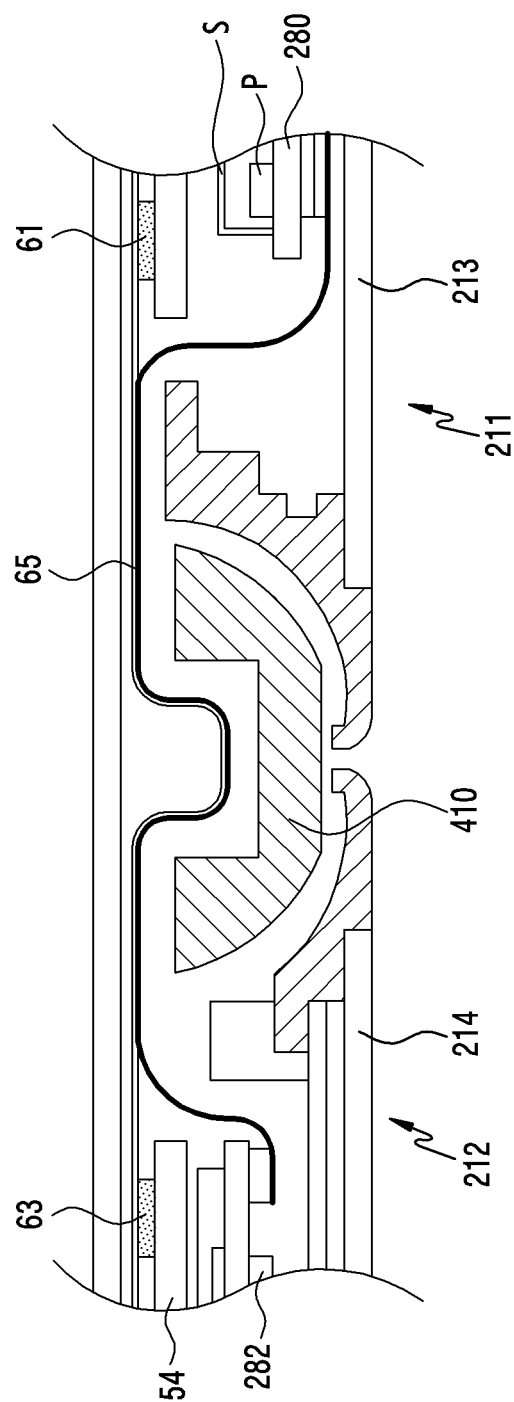
FIG. 14 is a cross-sectional view illustrating a state where a heat transfer sheet is mounted according to an embodiment of the disclosure.

FIG. 14 is a cross-sectional view illustrating a state where a heat transfer sheet is mounted according to an embodiment of the disclosure.

Referring to FIG. 14, a heat transfer sheet 65 according to an embodiment of the disclosure may be laminated at least in part with an FPCB 62. According to an embodiment of the disclosure, in the heat transfer sheet 65, a portion passing through a hinge housing 410 may be laminated with an FPCB 62. For example, an attaching scheme may be utilized in a laminating method. According to an embodiment of the disclosure, the heat transfer sheet 65 may be assembled when the FPCB 62 is assembled.

According to an embodiment of the disclosure, since the remaining structures of the heat transfer sheet 65 are the same as those of the heat transfer sheet 64 of FIGS. 12, 13A and 13B, detailed descriptions thereof will be omitted to avoid redundancy.

Hereinafter, a structure of a heat transfer sheet will be described with reference to FIGS. 15A, 15B, 16A, 16B, 17A, 17B, 18A, and 18B.

Figure 15A:
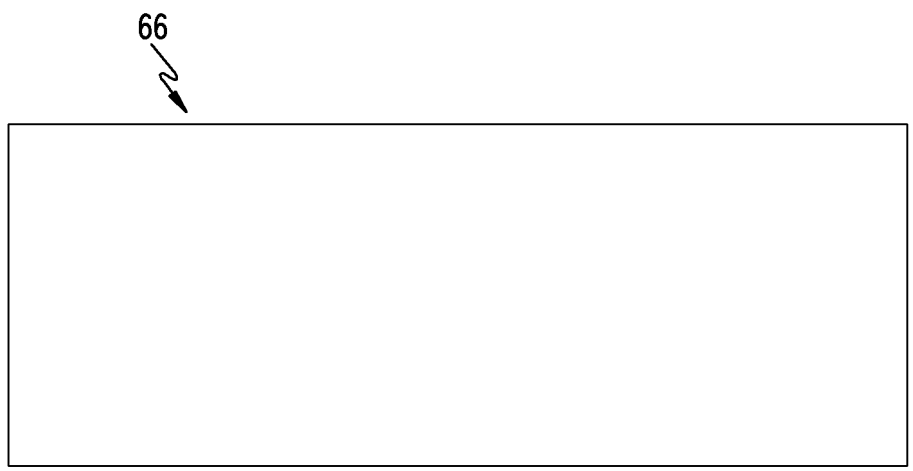
FIG. 15A is a plan view illustrating a heat transfer sheet according to an embodiment of the disclosure.

FIG. 15A is a plan view illustrating a heat transfer sheet according to an embodiment of the disclosure.

Figure 15B:
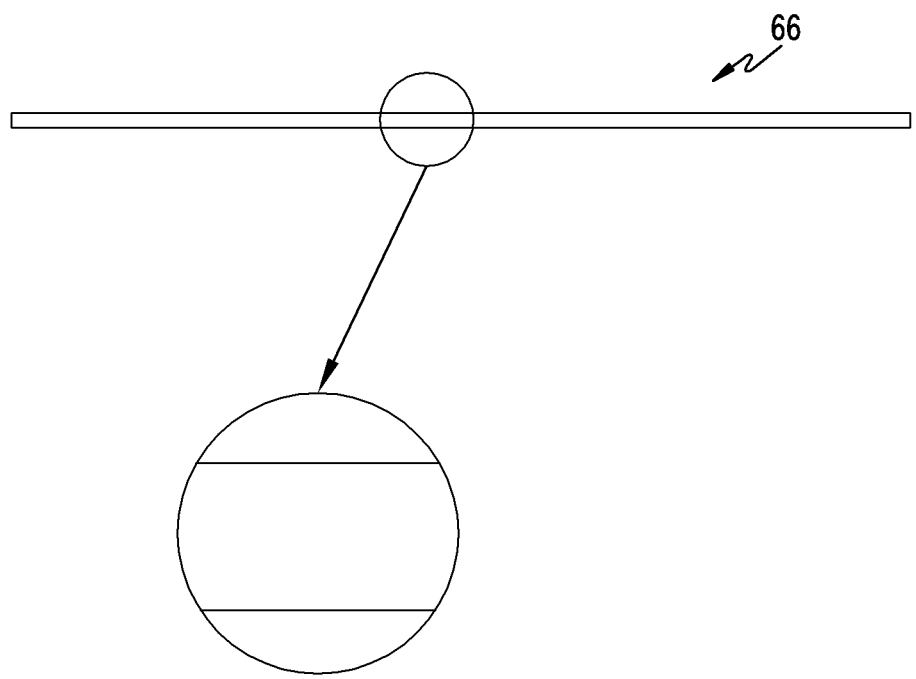
FIG. 15B is a side view illustrating a heat transfer sheet according to an embodiment of the disclosure.

FIG. 15B is a side view illustrating a heat transfer sheet according to an embodiment of the disclosure.

Referring to FIGS. 15A and 15B, a heat transfer sheet 66 according to an embodiment may be the heat transfer sheet 64 of in FIGS. 12, 13A, and 13B and the heat transfer sheet 65 of FIG. 14.

According to an embodiment of the disclosure, the heat transfer sheet 66 may be formed of a single material. For example, the heat transfer sheet 66 may include a graphite material.

Figure 16A:
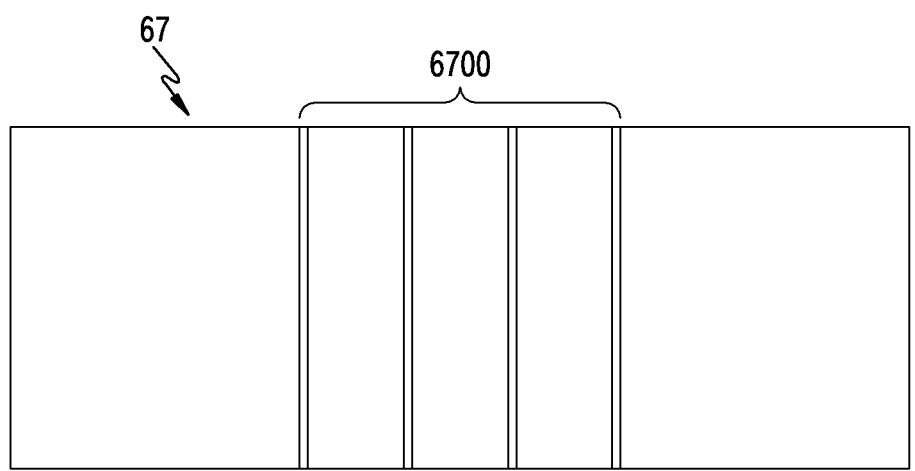
FIG. 16A is a plan view illustrating a heat transfer sheet according to an embodiment of the disclosure.

FIG. 16A is a plan view illustrating a heat transfer sheet according to an embodiment of the disclosure.

Figure 16B:
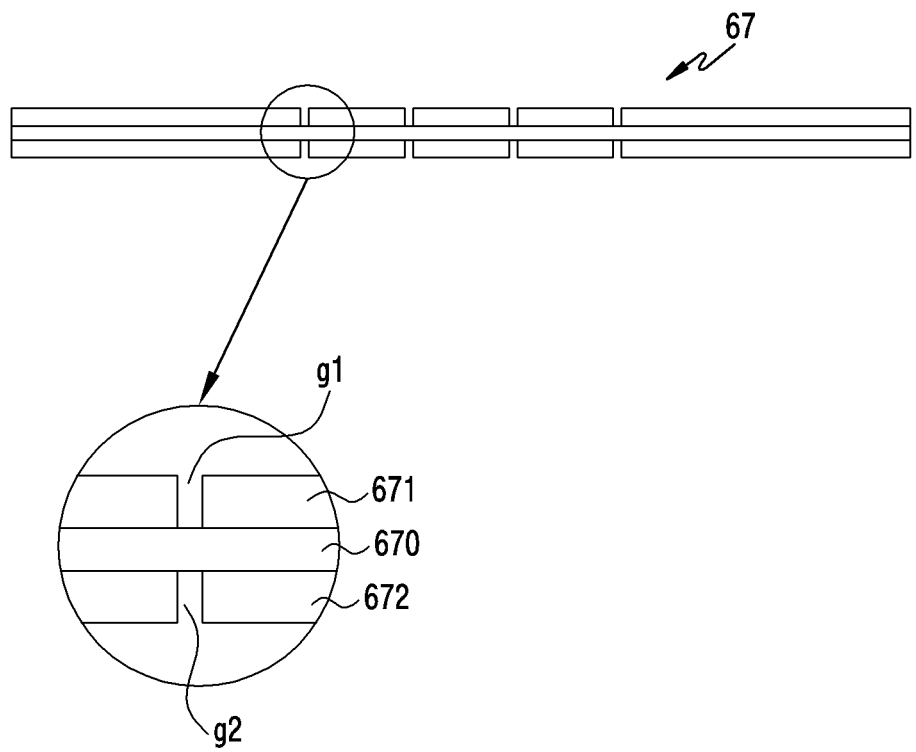
FIG. 16B is a side view illustrating a heat transfer sheet according to an embodiment of the disclosure.

FIG. 16B is a side view illustrating a heat transfer sheet according to an embodiment of the disclosure.

Referring to FIGS. 16A and 16B, a heat transfer sheet 67 according to an embodiment may be at least one portion of the heat transfer sheet 64 of FIGS. 12, 13A, and 13B and at least one portion of the heat transfer sheet 65 of FIG. 14.

According to an embodiment of the disclosure, the heat transfer sheet 67 may be formed of multiple layers of heterogeneous materials. Therefore, the heat transfer sheet 67 may be referred to as a heat transfer composite sheet. According to an embodiment of the disclosure, the heat transfer sheet 67 may include a stretchable material layer 670 and first and second graphite sheets 671 and 672 respectively attached to one face and the other face of the stretchable material layer 670. According to an embodiment of the disclosure, the heat transfer sheet 67 may have a plurality of gaps g1 and g2 formed at a folding portion 6700 in order to overcome a difference in elongation between the first and second graphite sheets 671 and 672 due to folding. According to an embodiment of the disclosure, the first graphite sheet 671 may have the plurality of first gaps g1 formed to be spaced apart at the folding portion, and the second graphite sheet 672 may have the plurality of second gaps g2 formed to be spaced apart at the folding portion.

According to an embodiment of the disclosure, each of the first and second graphite sheets 671 and 672 may have a thickness approximately between 17 μm and 70 μm.

According to an embodiment of the disclosure, each of the first gaps g1 may have a size approximately between 0.2 mm and 0.3 mm, and each of the second gaps g2 may have a size approximately between 0.2 mm and 0.3 mm. For example, the first gaps g1 may be spaced apart from each other by the same distance, and the second gaps g2 may be spaced apart from each other by the same distance.

Figure 17A:
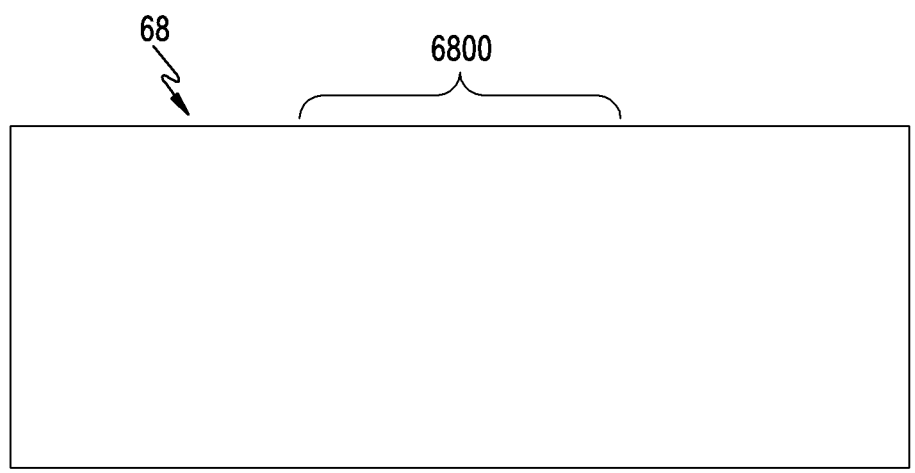
FIG. 17A is a plan view illustrating a heat transfer sheet according to an embodiment of the disclosure.

FIG. 17A is a plan view illustrating a heat transfer sheet according to an embodiment of the disclosure.

Figure 17B:
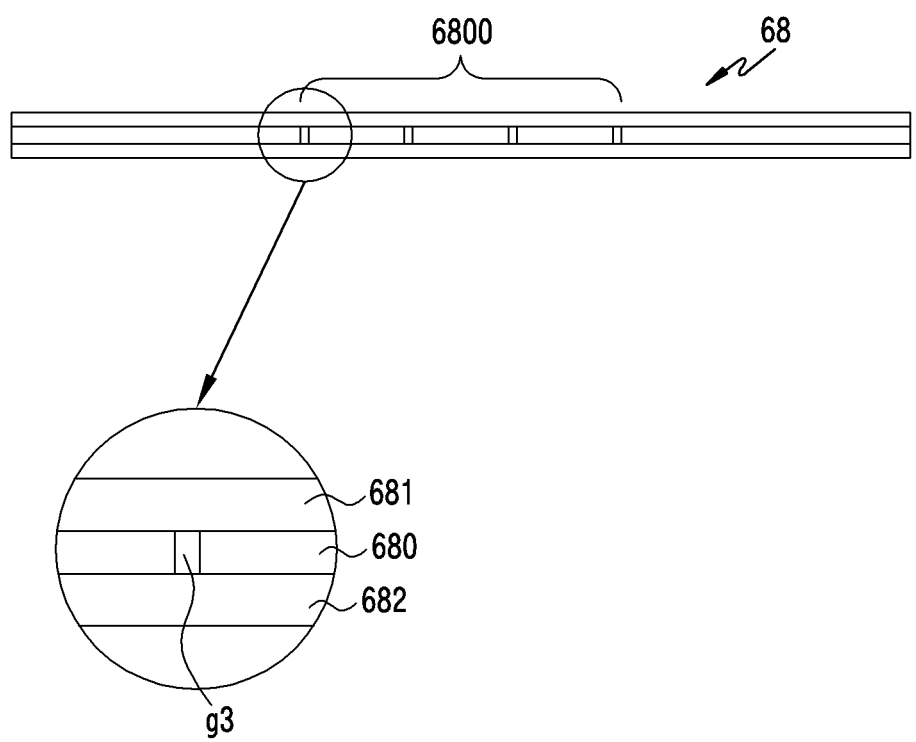
FIG. 17B is a side view illustrating a heat transfer sheet according to of the disclosure embodiment of the disclosure.

FIG. 17B is a side view illustrating a heat transfer sheet according to of the disclosure embodiment of the disclosure.

Referring to FIGS. 17A and 17B, a heat transfer sheet 68 according to an embodiment may be the heat transfer sheet 64 of FIGS. 12, 13A, and 13B and the heat transfer sheet 65 of FIG. 14.

According to an embodiment of the disclosure, the heat transfer sheet 68 may be formed of multiple layers of heterogeneous materials. Therefore, the heat transfer sheet 68 may be referred to as a heat transfer composite sheet. According to an embodiment of the disclosure, the heat transfer sheet 68 may include a stretchable material layer 680 and first and second graphite sheets 681 and 682 respectively attached to one face and the other face of the stretchable material layer 680. According to an embodiment of the disclosure, the heat transfer sheet 68 may have a plurality of gaps g3 formed at a folding portion. According to an embodiment of the disclosure, the plurality of gaps g3 may be formed to be spaced apart.

Figure 18A:
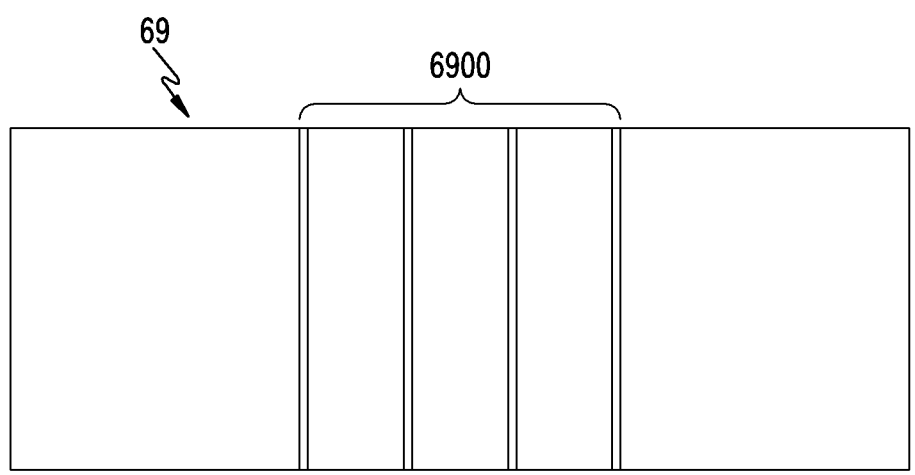
FIG. 18A is a plan view illustrating a heat transfer sheet according to an embodiment of the disclosure.

FIG. 18A is a plan view illustrating a heat transfer sheet according to an embodiment of the disclosure.

Figure 18B:
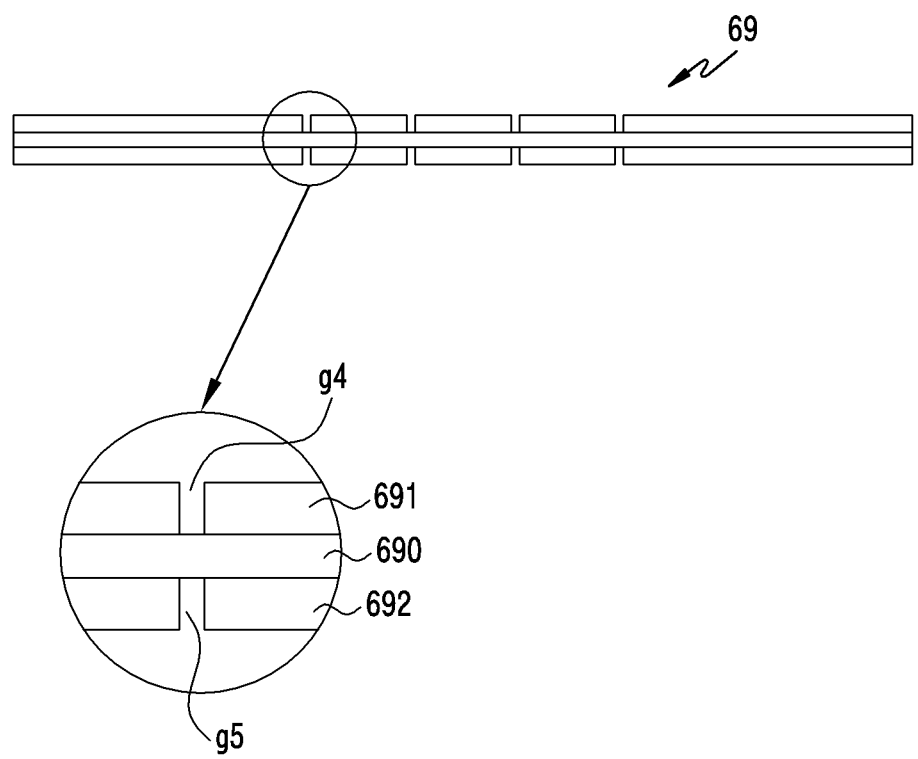
FIG. 18B is a side view illustrating a heat transfer sheet according to an embodiment of the disclosure.

FIG. 18B is a side view illustrating a heat transfer sheet according to an embodiment of the disclosure.

Referring to FIGS. 18A and 18B, a heat transfer sheet 69 according to an embodiment may be the heat transfer sheet of FIGS. 12, 13A, and 13B and the heat transfer sheet of FIG. 14.

According to an embodiment of the disclosure, the heat transfer sheet 69 may be formed of multiple layers of heterogeneous materials. Therefore, the heat transfer sheet 69 may be referred to as a heat transfer composite sheet. According to an embodiment of the disclosure, the heat transfer sheet 69 may include a stretchable material layer 690 and first and second graphite sheets 691 and 692 respectively attached to one face and the other face of the stretchable material layer 690. According to an embodiment of the disclosure, the heat transfer sheet 69 may have a plurality of gaps g4 and g5 formed at a folding portion 6900 in order to overcome a difference in elongation between the first and second graphite sheets 691 and 692 due to folding. According to an embodiment of the disclosure, the first graphite sheet 691 may have the plurality of first gaps g4 formed to be spaced apart at the folding portion, and the second graphite sheet 692 may have the plurality of second gaps g5 formed to be spaced apart at the folding portion.

Figure 19A:
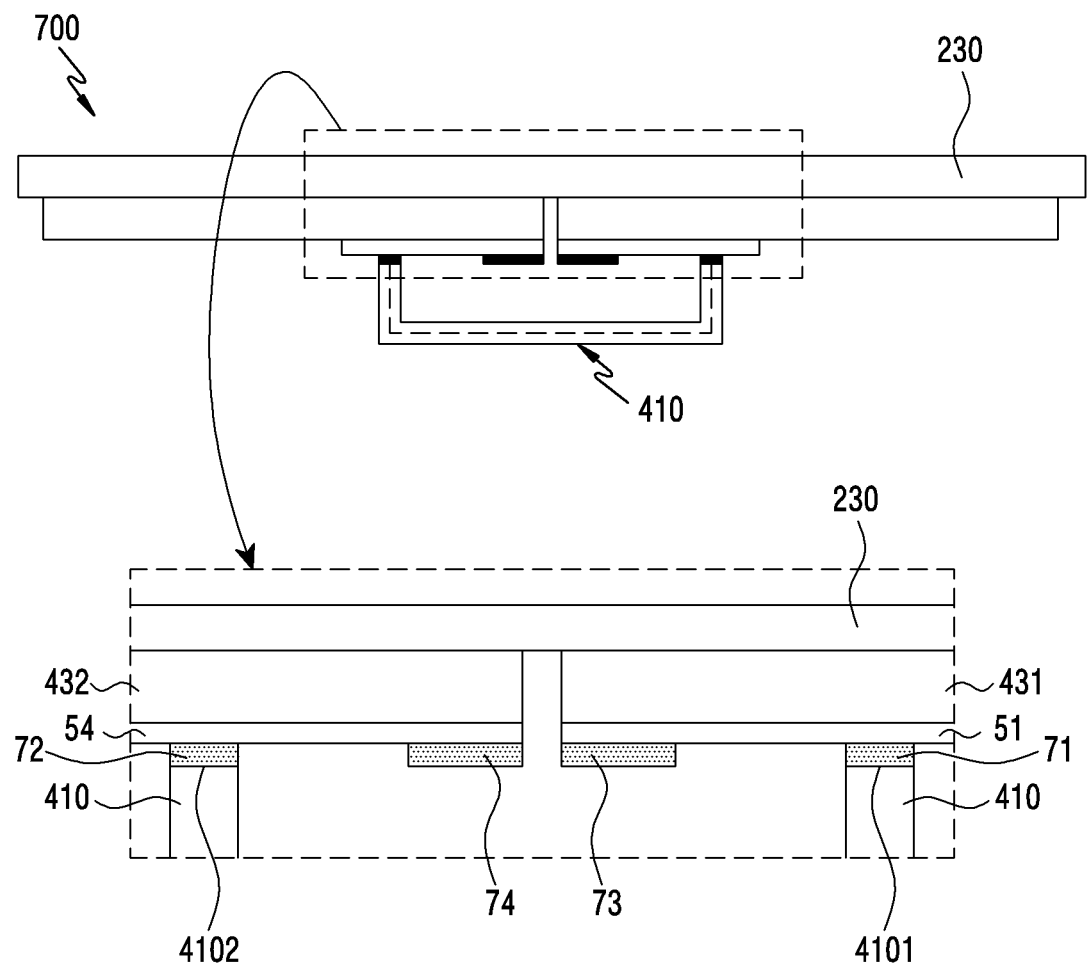
FIG. 19A is a side view illustrating a heat dissipating structure of an electronic device in an unfolded state according to an embodiment of the disclosure.

FIG. 19A is a side view illustrating a heat dissipating structure of an electronic device in an unfolded state according to an embodiment of the disclosure.

Figure 19B:
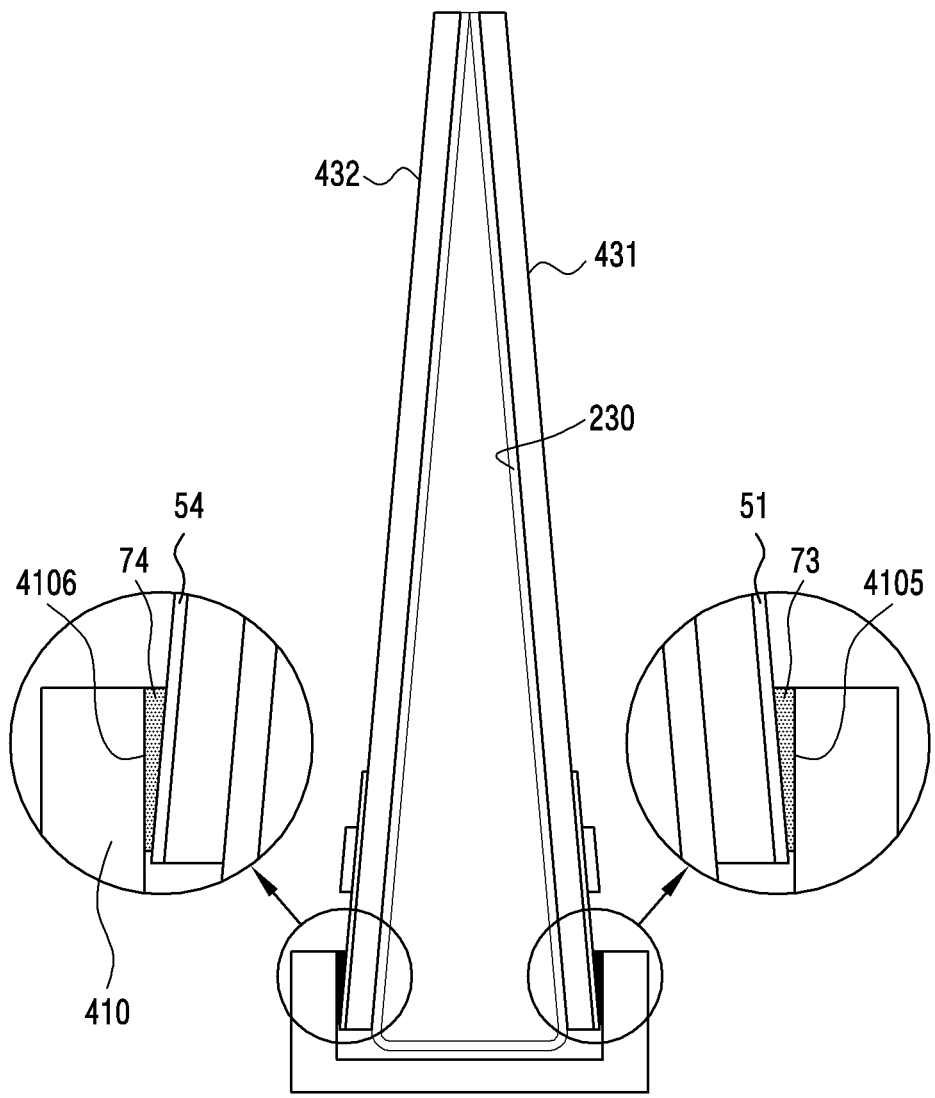
FIG. 19B is a side view illustrating a heat dissipating structure of an electronic device in a folded state according to an embodiment of the disclosure.

FIG. 19B is a side view illustrating a heat dissipating structure of an electronic device in a folded state according to an embodiment of the disclosure.

Referring to FIGS. 19A and 19B, an electronic device 700 according to an embodiment may include a heat dissipating structure providing first and second heat transfer paths for transferring heat generated from a heating element in an unfolded state and a folded state, respectively. According to an embodiment of the disclosure, the heat dissipating structure may include first and second plates 431 and 432, a hinge housing 410, first and fourth heat transfer members 51 and 54, and first to fourth TIMs 71, 72, 73, and 74.

According to an embodiment of the disclosure, the first and second plates 431 and 432 and the hinge housing 410 may be the same as the first and second plates 431 and 432 and the hinge housing 410 shown in FIG. 5A. According to an embodiment of the disclosure, the first heat transfer member 51 may be coupled to face the first plate 431 and rotates together, and the fourth heat transfer member 54 may be disposed to face the second plate 432 and rotate together.

Referring to FIG. 19A, according to an embodiment of the disclosure, in a state where the electronic device 700 is in a 180-degree unfolded state, the hinge housing 410 may be disposed between the first and second plates 431 and 432. One end 4101 may be thermally coupled to the first plate 431 by means of the first TIM 71, and the other end 4102 may be thermally coupled to the second plate 432 by means of the second TIM 72. A heat transfer path may be provided according to the unfolding of the electronic device 700. Heat transferred to the first heat transfer member 51 may be transferred to one end 4101 of the hinge housing 410 through the first TIM 71. Heat transferred to the one end 4101 may be transferred to the other end 4102 through the hinge housing 410. Heat transferred to the other end 4102 may be transferred to the fourth heat transfer member 54 through the second TIM 72.

Referring to FIG. 19A, according to an embodiment of the disclosure, in a state where the electronic device 700 is in a folded state, the first heat transfer member 51 may be thermally coupled to a first portion 4105 of the hinge housing 410 by means of the third TIM 73, and the fourth heat transfer member 54 may be thermally coupled to a second portion 4106 by means of the fourth TIM 74. A heat transfer path may be provided according to the folding of the electronic device 700. Heat transferred to the first heat transfer member 51 may be transferred to the first portion 4105 of the hinge housing 410 through the third TIM 73. Heat transferred to the first portion 4105 may be transferred to the second portion 4106 through the hinge housing 410. Heat transferred to the second portion 4106 may be transferred to the fourth heat transfer member 54 through the fourth TIM 74.

Figure 20:
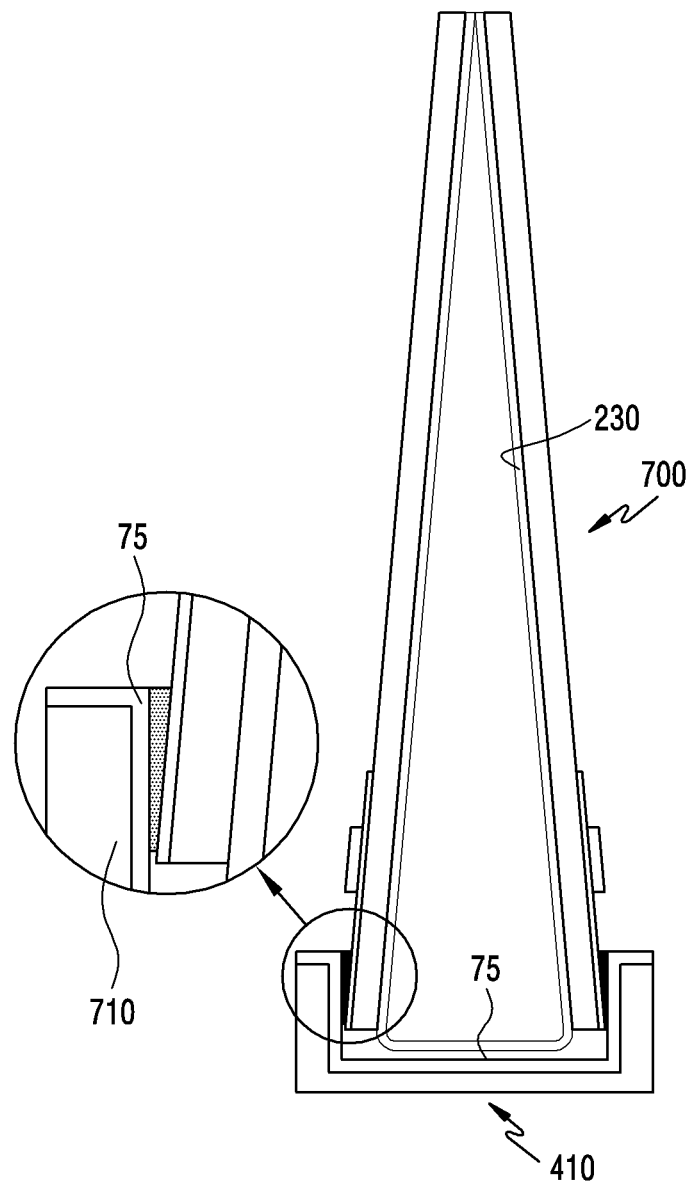
FIG. 20 is a side view illustrating a heat dissipating structure of an electronic device in a folded state according to an embodiment of the disclosure.

FIG. 20 is a side view illustrating a heat dissipating structure of an electronic device in a folded state according to an embodiment of the disclosure.

Referring to FIG. 20, since a heat dissipating structure according to an embodiment is different from the heat dissipating structure of FIGS. 19A and 19B only in the structure of the hinge housing 410 and the remaining structures are identical, detailed descriptions on the remaining structure will be omitted to avoid redundant descriptions.

The hinge housing 410 according to an embodiment may be formed by combining heterogeneous materials. According to an embodiment of the disclosure, the hinge housing 410 may have a TIM layer 75 formed therein. For example, a graphite sheet may be attached or a nanofiber coating layer may be applied. When an electronic device 700 is folded, a third TIM 73 may be thermally coupled to the TIM layer 75 of one end of the hinge housing 410, and a fourth TIM 74 may be thermally coupled to the TIM layer 75 of the other end of the hinge housing 410. For example, when the electronic device 700 is folded, the TIM layer 75 may provide a heat transfer path, so that the heat transferred from a first heat transfer member 51 is transferred to a fourth heat transfer member 54 via the third TIM 73, the TIM layer 75, and the fourth TIM 74.

Figure 21:
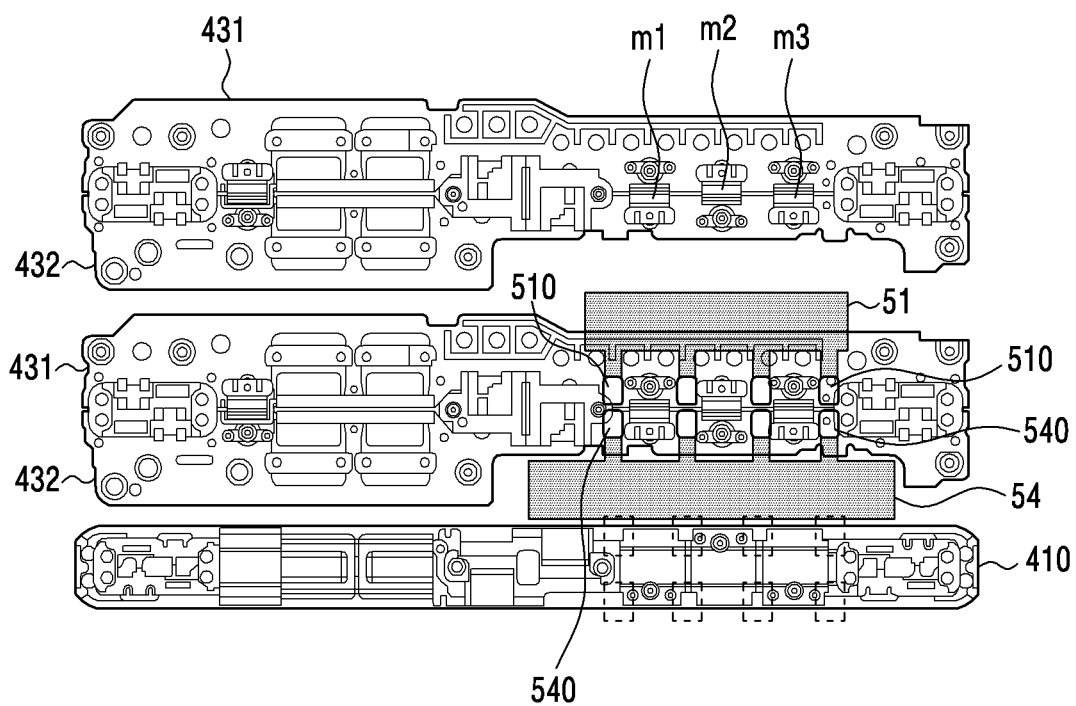
FIG. 21 is a plan view illustrating a state where a heat transfer member is disposed between movable structures of first and second plates according to an embodiment of the disclosure.

FIG. 21 is a plan view illustrating a state where a heat transfer member is disposed between movable structures of first and second plates according to an embodiment of the disclosure.

Referring to FIG. 21, according to various embodiments of the disclosure, first and fourth heat transfer members 51 and 54 may be disposed to first and second plates 431 and 432 and may be disposed between movable structures m1, m2, and m3 present in the first and second plates 431 and 432. According to an embodiment of the disclosure, the first and forth heat transfer members 51 and 54 may be disposed to a flat portion between the movable structures m1, m2, and m3 of the first and second plates and thus may be utilized as a heat transfer structure.

According to an embodiment of the disclosure, TIMs 510 and 540 may be disposed to one portion of the first and fourth heat transfer members 51 and 54 disposed between the movable structures m1, m2, and m3, and the TIMs 510 and 540 may be thermally coupled to a hinge housing 410. For example, the TIMs 510 and 540 may include a double-sided heat transfer tape.

According to an embodiment of the disclosure, the first and fourth heat transfer members 51 and 54 disposed between the movable structures m1, m2, and m3 (e.g., a hinge spring or hinge cam of the hinge assembly) may reduce or remove a step between the movable structures. For example, a structure in which the TIMs 510 and 540 are disposed at four places between the three movable structures m1, m2, and m3 is exemplified in FIG. 21.

Figure 22:
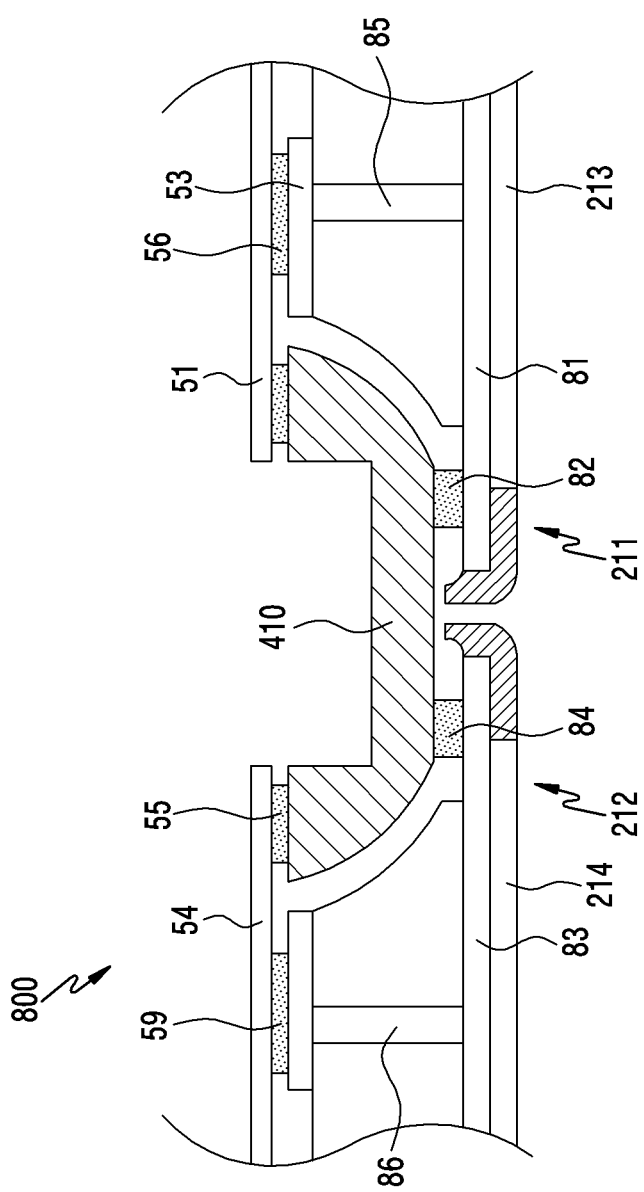
FIG. 22 is a cross-sectional view illustrating a heat dissipating structure of an electronic device according to an embodiment of the disclosure.

FIG. 22 is a cross-sectional view illustrating a heat dissipating structure of an electronic device according to an embodiment of the disclosure.

Referring to FIG. 22, when an electronic device 800 is in an unfolded state, according to an embodiment of the disclosure, a heat dissipating structure may transfer heat to a hinge housing 410 by using fibers containing heat dissipating particles. The hinge housing 410 may have a fiber layer disposed at each of both ends to prevent foreign substances from entering into first and second housings. The fiber layer may be utilized as a heat transfer member by applying thermal particles to the fiber layer.

According to an embodiment of the disclosure, the heat dissipating structure may include a first heat transfer metal plate 81 disposed to face a first back cover 213, and a first heat transfer fiber layer 82 disposed between the first heat transfer metal plate 81 and the hinge housing 410. According to an embodiment of the disclosure, the heat dissipating structure may include a second heat transfer metal plate 83 disposed to face a second back cover 214, and a second heat transfer fiber layer 84 disposed between the second heat transfer metal plate 83 and the hinge housing 410. For example, the first and second heat transfer fiber layers 82 and 84 may be in charge of a function of a member for preventing foreign substances from entering into first and second housing 211 and 212.

According to an embodiment of the disclosure, the first heat transfer metal plate 81 may further include a first heat transfer connection member 85 to transfer heat generated from a third heat transfer member 53. According to an embodiment of the disclosure, the second heat transfer metal plate 83 may further include a second heat transfer connection member 86 to transfer heat generated from a fourth heat transfer member 54.

According to an embodiment of the disclosure, part of the heat transferred from the third heat transfer member 53 may be transferred to a first heat transfer member 51 via a third TIM 56, and the remaining parts may be transferred to the first heat transfer metal plate 81 by means of the first heat transfer connection member 85. The heat transferred to the first heat transfer metal plate 81 may be transferred to the hinge housing 410 by means of the first heat transfer fiber layer 82.

According to an embodiment of the disclosure, the heat transferred to the hinge housing 410 may be transferred to the second heat transfer metal plate 83 by means of the second heat transfer fiber layer 84.

Figure 23A:
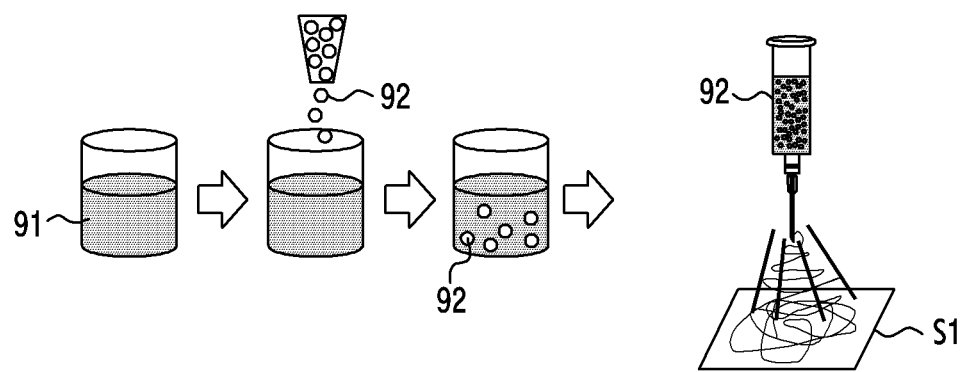
FIGS. 23A and 23B briefly illustrate in sequence an example of a process of manufacturing a fiber sheet including a heat-dissipating particle according to various embodiments of the disclosure.
Figure 23B:
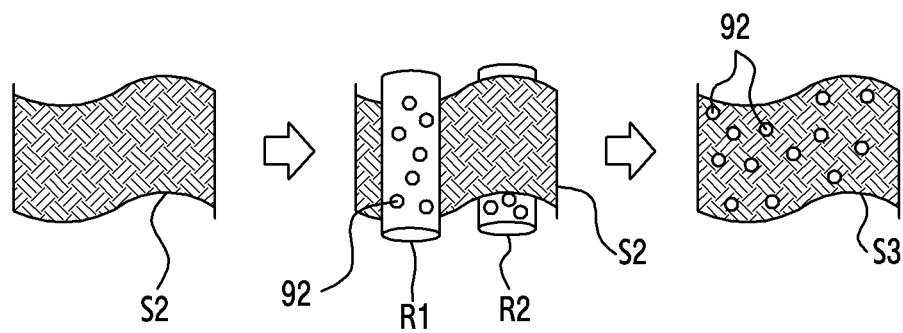

FIGS. 23A and 23B briefly illustrate in sequence an example of a process of manufacturing a fiber sheet including a heat-dissipating particle according to various embodiments of the disclosure.

A process of manufacturing a fiber sheet including a heat-dissipating particle in an embodiment will be described below with reference to FIGS. 23A and 23B.

A heat-dissipating particle 92 may be supplied in a liquid polymer resin 91 inside a container according to an embodiment and then may be mixed uniformly inside the container. The liquid polymer resin 91 in which the heat-dissipating particle 92 is mixed may be sprayed onto a fiber sheet 51 prepared through a supply device, thereby obtaining a fiber sheet having the heat-dissipating particle 92 included therein. According to an embodiment of the disclosure, the plurality of heat-dissipating particles 92 are metal particles which transfer heat, and may include, for example, a plurality of copper oxide particles.

Figure 24:
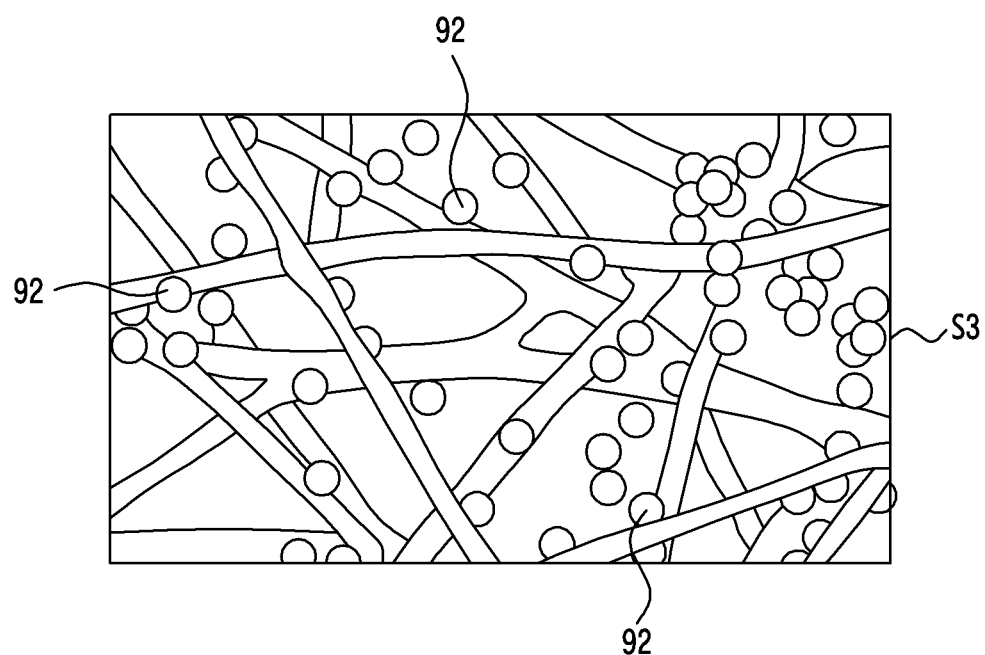
FIG. 24 is a microscopic view of a fiber sheet containing a heat-dissipating particle manufactured according to an embodiment of the disclosure.

FIG. 24 is a microscopic view of a fiber sheet containing a heat-dissipating particle manufactured according to an embodiment of the disclosure.

According to an embodiment of the disclosure, a prepared fiber sheet S2 may be compressed by rolling devices R1 and R2 to which the heat-dissipating particle 92 is supplied, and thus the heat-dissipating particle 92 may be applied to the fiber sheet S2. Through this process, the fiber sheet to which the heat-dissipating particle is applied may be obtained, and a manufactured fiber sheet S3 is shown in FIG. 24.

Finally, the complete fiber sheet S3 to which the heat-dissipating particle 92 is applied may be used as a fabric for the first and second heat transfer fiber layers 82 and 84.

While the disclosure has been shown and described with reference to various embodiments therefore, it will be understood by those skilled in the art that various changes in form and details may be made therein without departing from the spirit and scope of the disclosure as defined by the appended claims and their equivalents.

The invention claimed is:

1. A foldable electronic device comprising:
a housing including a first housing portion, a second housing portion, and a hinge housing portion at least partially disposed between the first housing portion and the second housing portion;
a hinge module accommodated in the housing and coupled with the first housing portion and the second housing portion;
a flexible display accommodated in the first housing portion and the second housing portion;
a first PCB accommodated in the first housing portion;
a second PCB accommodated in the second housing portion;
a flexible printed circuit board (FPCB) at least partially disposed between the hinge housing portion and the flexible display, and electrically connected between the first PCB and the second PCB; and
a heat transfer sheet including a first portion attached with the FPCB and a second portion configured to receive heat from a first component at the first PCB, and at least partially disposed between the hinge housing portion and the flexible display,
wherein heat from the first component at the first PCB is at least partially transferred to the second housing portion via the heat transfer sheet.

2. The foldable electronic device of claim 1, wherein the first portion is laminated with at least a portion of the flexible printed circuit board.

3. The foldable electronic device of claim 1, wherein the heat transfer sheet comprises a copper material.

4. The foldable electronic device of claim 1, wherein the heat transfer sheet comprises a graphite sheet.

5. The foldable electronic device of claim 1, wherein the heat transfer sheet is thermally coupled with the first PCB.

6. The foldable electronic device of claim 1, wherein the first portion is substantially formed to have a same width as the flexible printed circuit board.

7. The foldable electronic device of claim 1, wherein the first portion is disposed on a folding portion of the flexible printed circuit board.

8. The foldable electronic device of claim 1, wherein the first portion is via the hinge housing portion.

9. The foldable electronic device of claim 1, wherein the second portion is thermally coupled to a first heat transfer member accommodated in the first housing portion.

10. The foldable electronic device of claim 9, wherein the second portion is thermally coupled to the first heat transfer member by a first thermal interfacing material (TIM).

11. The foldable electronic device of claim 10, wherein the heat transfer sheet includes a third portion thermally coupled to a portion of the second housing portion via the first portion.

12. The foldable electronic device of claim 11, wherein the third portion is thermally coupled to the second heat transfer member accommodated in the second housing portion.

13. The foldable electronic device of claim 12, wherein the third portion is thermally coupled to the second heat transfer member by a second TIM.

14. The foldable electronic device of claim 1, wherein the heat transfer sheet is formed of either a single material or a heterogeneous material.

15. The foldable electronic device of claim 14, wherein the heat transfer sheet is formed of multiple layers.

16. The foldable electronic device of claim 15, wherein the heat transfer sheet comprises;

a copper material layer formed on one surface; and at least one graphite layer formed on the other surface opposite to the one surface.

17. The foldable electronic device of claim 16, wherein the copper material layer has at least one first gap formed at a folding portion of the heat transfer sheet.

18. The foldable electronic device of claim 17, wherein the at least one graphite layer has at least one second gap formed at a folded portion of the heat transfer sheet.

* * * * *